US009377517B2

(12) United States Patent
Witschey et al.

(10) Patent No.: US 9,377,517 B2
(45) Date of Patent: Jun. 28, 2016

(54) METHOD OF DYNAMICALLY COMPENSATING FOR MAGNETIC FIELD HETEROGENEITY IN MAGNETIC RESONANCE IMAGING

(75) Inventors: Walter Witschey, Philadelphia, PA (US); Maxim Zaitsev, Freiburg (DE); Jürgen Hennig, Freiburg (DE); Gerrit Schultz, Freiburg (DE); Daniel Gallichan, Freiburg (DE)

(73) Assignee: UNIVERSITAETSKLINIKUM FREIBURG, Freiburg (DE)

( * ) Notice: Subject to any disclaimer, the term of this patent is extended or adjusted under 35 U.S.C. 154(b) by 1131 days.

(21) Appl. No.: 13/414,737

(22) Filed: Mar. 8, 2012

(65) Prior Publication Data
US 2012/0249137 A1    Oct. 4, 2012

(30) Foreign Application Priority Data

Mar. 29, 2011   (EP) .................................... 11160229

(51) Int. Cl.
*G01R 33/58*    (2006.01)
*G01R 33/3875*    (2006.01)

(52) U.S. Cl.
CPC ................................. *G01R 33/3875* (2013.01)

(58) Field of Classification Search
CPC .... A61B 5/0035; A61B 5/055; G01R 33/243; G01R 33/3875; G01R 33/543; G01R 33/5608; G01R 33/56509; G01R 33/5673; G01R 33/5676
USPC .......................... 324/300–322; 600/407–422
See application file for complete search history.

(56) References Cited

U.S. PATENT DOCUMENTS

2007/0252597 A1 * 11/2007 Posse ............................ 324/312
2008/0164878 A1 *  7/2008 Morich .............. G01R 33/3875
                                                          324/320
2010/0127702 A1 *  5/2010 Greiser et al. ................ 324/309

FOREIGN PATENT DOCUMENTS

EP        2 410 347          1/2012

OTHER PUBLICATIONS

Stockmann, J. P., Ciris, P. A., Galiana, G., Tam, L. and Constable, R. T. (2010), O-space imaging: Highly efficient parallel imaging using second-order nonlinear fields as encoding gradients with no phase encoding. Magn Reson Med, 64: 447-456. doi: 10.1002/mrm. 22425.*

(Continued)

Primary Examiner — Melissa Koval
Assistant Examiner — Rishi Patel
(74) Attorney, Agent, or Firm — Paul Vincent

(57) ABSTRACT

A method to compensate for the magnetic field heterogeneity inside an object of investigation in a MR device obtains an uncorrected magnetic field distribution of the object and executes an MR sequence with a desired k-space coverage by applying RF pulses to generate a transverse magnetization within the object. MR signal data is recorded, magnetic field shimming parameters are dynamically updated and MR signal data are reconstructed to produce images or localized spectroscopic data. Artifacts in a reconstructed image resulting from an uncorrected magnetic field distribution are suppressed by temporally separating MR signals originating from at least two different sub-volumes within a volume of transverse magnetization by generating a nonlinear phase distribution within the object and by dynamically updating shimming parameters to compensate for the field inhomogeneity distributions within the different sub-volumes in the volume of transverse magnetization.

17 Claims, 10 Drawing Sheets

(56) References Cited

OTHER PUBLICATIONS

A.A. Maudsley, "Dynamic Range Improvement in NMR Imaging Using Phase Scrambling", Journal of Magnetic Resonance 76, 287-305 (1988).

James G. Pipe "Spatial Encoding and Reconstruction in MRI with Quadratic Phase Profiles", MRM 33:24-33 (1995).

Satoshi Ito et al., "Alias-Free Image Reconstruction Using Fresnel Transform in the Phase-Scrambling Fourier Imaging Technique", Magnetic Resonance in Medicine 60:422-430 (2008).

Noam Ben-Eliezer et al., "High-definition, single-scan 2D MRI in inhomogeneous fields using spatial encoding methods", Magnetic Resonance Imaging 28 (2010) 77-86.

Yoshifumi Yamada, "NMR Fresnel transform imaging technique using a quadratic nonlinear field gradient", Rev.Sci.Instrum 63 (11), Nov. 1992, 0034-6748/92/115348-11502.00 © 1992 American Institute.

Andrew M. Blamire et al., "Dynamic Shim Updating: A New Approach Towards Optimized Whole Brain Shimming", MRM 36:159-165 (1996).

Robin A. De Graaf et al., "Dynamic Shim Updating (DSU) for Multislice Signal Acquisition", Magnetic Resonance in Medicine 49:409-416 (2003).

Assaf Tal et al., "Spatial encoding and the single-scan acquisition of high definition MR images in inhomogeneous fields", Journal of Magnetic Resonance 182 (2006) 179-194.

* cited by examiner

METHOD OF DYNAMICALLY COMPENSATING FOR MAGNETIC FIELD HETEROGENEITY IN MAGNETIC RESONANCE IMAGING

This application claims Paris Convention priority of EP 11 160 229.8 filed Mar. 29, 2011 the complete disclosure of which is hereby incorporated by reference.

BACKGROUND OF THE INVENTION

This invention relates to a method to compensate for the magnetic field heterogeneity inside of an object of investigation inside of a magnetic resonance device, comprising:
(A) determining experimentally or theoretically spatial field distributions and temporal switching characteristics of field manipulating coils present in the magnetic resonance (MR) apparatus including B0 offset coil, linear gradients, non-linear encoding fields and shim coils of first and higher orders;
(B) obtaining an uncorrected magnetic field distribution of the object of investigation by measuring (i) the heterogeneity of the static magnetic field and (ii) the heterogeneity caused by susceptibility variations associated with the object of investigation;
(C) executing an MR sequence on the MR device with a desired k-space coverage by applying one or several RF pulses to generate a transverse magnetization within the object of investigation, switching currents in the field manipulating coils to effect a primary spatial encoding and recording MR signal data;
(D) dynamically updating one or several magnetic field shimming parameters such as carrier frequency shift, offsets of the primary encoding fields or currents applied to the field manipulating coils;
(E) performing reconstruction of the MR signal data acquired in step (c) to produce one or more images or localized spectroscopic data.

A state-of-the-art method with these features has been described in {24}, where the magnetic field heterogeneity inside of an object of investigation inside of a magnetic resonance device is compensated over an extended volume by dynamically updating the magnetic field. This method is also called dynamic shim updating. In contrast to static shimming, where one optimal shim set is determined for the whole volume, the method described in {24} allows one to apply optimal shimming parameters consecutively to each excited slice, thereby improving image quality. In this description, this method is called inter-slice shimming. However, this method does not allow one to improve the image quality by updating the shimming parameters during the acquisition of a single slice. This latter method is called here intra-slice shimming.

The reason for this limitation is the fact that in state-of-the-art methods like {24}, the signals that originate from different sub-volumes in the object are synchronized, i.e., the signal echoes contain signals from all excited sub-volumes simultaneously. Therefore, shim updates usually affect all signal contributions at once. To better understand this problem, consider shim parameter optimization for a sub-volume of a 2D spatially encoded slice or 3D spatially encoded slab. In these situations, the local magnetic field homogeneity in the sub-volume would be improved only to its deterioration elsewhere. That is to say that an improvement in image quality would be expected in the sub-volume and a deterioration of the image quality would result outside of this sub-volume. This problem is not solved by dynamically updating the shimming parameters during the acquisition for the second sub-volume in the slice because of two reasons. First, the image quality might be improved in this second sub-volume, however, it deteriorates for the first sub-volume in the slice. Second, data inconsistencies evolve with adverse effects on the whole image quality.

SUMMARY OF THE INVENTION

The present invention solves the problem of intra-slice shimming. This is possible by (1) performing MRI spatial encoding, (2) creating a nonlinear phase distribution, e.g., by applying a current through a magnet coil producing a nonlinear magnetic field, and (3) dynamically updating the shim coils. The consequence of this additional nonlinear phase distribution is temporal separation of signal echoes originating from different excited sub-volumes. This effect has been observed before {1-6}. In {3,7} the effect of temporal signal separation is explained in detail. The present invention exploits the fact that with a nonlinear phase preparation, signal echoes originating from different sub-volumes occur at different times during data acquisition. In the present invention, the shimming parameters are updated during the acquisition process, and thus echoes originating from distinct sub-volumes are affected with different shimming parameters, which are optimal for each sub-volume. The consequence is a more homogeneous effective field distribution and thus a higher image quality results. It is important to note that this invention improves the image quality while the acquisition is performed in the usual amount of time.

The beneficial effect to image quality can be understood by noting that with the nonlinear phase preparation the time of echo formation and spatial origin of the formed echo become related to each other. In other words, for a particular time-point signal energy predominately originates only from a particular sub-volume within the object. The effect might be denoted as k-space signal localization {40}. The publication {40} has been submitted at the European Patent Office and is not yet published at the time of filing of the present publication. Considering the signal localization effect, it is therefore possible to homogenize the sub-volume which currently contributes signal energy by dynamically updating the shimming parameters optimized to that particular sub-volume. The deterioration of field homogeneity outside of the localized sub-volume has little effect on the overall image quality because no signal (or at least strongly suppressed signal energy) is originating from these parts of the object at the current time-point. When the echoes from other parts of the object are formed, the shimming parameters are updated accordingly and optimal field homogeneity is always ensured. Therefore, it is possible to perform intra-slice shimming with the invention claimed without the adverse effects which would result based on prior art like {24}.

The additional nonlinear phase distribution within the object of investigation might be generated by applying a current to one or more of the field manipulating coils, at least one of which having a nonlinear field distribution; or by applying an appropriate RF-pulse or pulses resulting in a non-linear phase distribution of the excited magnetization in at least one spatial dimension; or by applying a combination of the two mentioned approaches.

To summarize, this invention allows the suppression of artifacts in the reconstructed image resulting from the uncorrected magnetic field distribution by
(AA) temporally separating MR signals from at least two different sub-volumes within the volume of transverse magnetization by generating a nonlinear phase distribution within the object of investigation by (AAA) applying in step (C) a current to the field manipulating coils, at least one of which having a nonlinear field distribution; or by (AAB) applying in step (C) an appropriate RF-pulse or pulses resulting in a non-linear phase distribution of the excited magnetization in at least one spatial dimension; or by (AAC) applying in step (C) a combination of the steps (AAA) and (AAB); and by (BB) dynamically updating the shimming parameters to compensate for the field inhomogeneity distributions within the at least two different sub-volumes within the volume of transverse magnetization.

The basic and state-of-the-art methodology and systems underlying the homogenization of a magnetic field are described in conjunction with a MRI apparatus in a review article {8}. Briefly, homogeneity of the static magnetic field $B_0$ for magnetic resonance imaging (MRI) is critical for MR applications. Despite the best efforts to prevent deviations from the ideal geometrical construction of the static magnetic field-producing conductors to ensure homogeneity, considerable $B_0$ field heterogeneity is introduced by the introduction of objects with non-uniform and spatially varying magnetic susceptibility into the MRI device. Variations in the anatomy of air cavities and biological tissues between human subjects, together with variation introduced by subject movement, respiration and other physiological motion, can cause signification spatial and temporal deterioration of the magnetic field homogeneity. Nevertheless, magnetic field homogeneity is of fundamental importance to the quality of the MRI images that are obtained. Even slight deviations in the magnetic field homogeneity, on the order of 1-2 parts-per-million (ppm), birth a constellation of image artifacts, which limit spatial resolution, total acquisition time and diagnostic image quality.

Through a process known as "shimming", the magnetic field heterogeneity inside a magnetic resonance device may be compensated or removed. There are two general methods for shimming: passive shimming, which may use pieces of ferromagnetic materials placed in strategic locations within the magnetic field {8-12} or intraoral diamagnetic materials {13,14} and active, which uses correcting magnetic field manipulating coils with desired spatial distributions, so-called shim coils. There are many limitations to the present shimming techniques, including the placement of ferromagnetic materials cannot be performed in a rapid time, without involving significant effort, or without large errors prior to use of the MRI device. In addition, these techniques are unable to compensate for the details of object-specific variations in the position, shape, magnetic susceptibilities and size of the magnetic field heterogeneity.

The current invention is related to methods of active, also called room-temperature (RT), shimming techniques. Active shimming includes (i) adjusting the global match between the transmitter and receiver frequency of the MR system and the Larmor frequency of spins within the object of investigation, which is either achieved by setting a current in a specialized field manipulating coil generating a global B0 offset or by adjusting the carrier frequency of the system; (ii) correcting linear spatial components of field heterogeneity either by setting currents in specialized field manipulating coils or by setting offset currents in the linear gradient fields (typically used for primary spatial encoding); and (iii) setting currents in one or several substantially-nonlinear field manipulating coils to compensate for the non-linear field heterogeneities. The plurality of the mentioned currents, gradient and frequency offset settings is often referred to as shim settings. For active shimming, the frequency offset at each location within the volume is typically determined using a method to measure the magnetic field heterogeneity, also called magnetic field mapping, and a compensating magnetic field is introduced by adjusting the abovementioned shimming parameters. In most methods the shim system is designed such that the effect of the shimming parameters on the object of investigation can be described by a combination of spherical harmonic functions. Most clinical MRI scanners are equipped shim systems with up to second order {15-17}. In MRI devices, this procedure usually occurs automatically prior to each the acquisition of a new imaging volume or orientation {18,19} or when a particular volume requires improved homogeneity, such as for spectroscopic imaging or echo-planar imaging (EPI).

There are several problems with existing technologies for magnetic field homogeneity improvement. Improvement of the total magnetic field homogeneity over an extended volume using shim gradients is limited. The requirements for magnetic field homogeneity for certain protocols, such as functional magnetic resonance imaging (MRI) have increased. In addition, the increasing magnetic field strength of the superconducting magnet demands better shim technology. Each additional, higher order, shim magnetic field has progressively smaller improvement in the homogeneity of the magnetic field {8}.

A subset of active shimming approaches have identified a method to improve the static magnetic field homogeneity through a process called dynamic shim updating (DSU). The reasoning is that it is usually desirable to decompose the volume of interest into a set of slices {20,21} or, conceptually, smaller sub-volumes {22} to reduce the field variation across the total volume. This technique results in real time adjustment of the shim magnetic fields during an MR acquisition called dynamic shim updating (DSU). The earliest DSU methods were used to independently homogenize voxels for multi-voxel magnetic resonance spectroscopy (MRS) {23}. A method for multi-slice DSU was implemented by Blamire, et al. {20} and Morrell, et al. {21}. DSU was later extended to higher order shim coils {24,25}. Shielded and resistive dynamic shimming coils have been designed that substantially reduce artifacts originating from eddy currents and coupling to other magnetic conductors. With increasing the order of modeled spherical harmonics it becomes, however, increasingly difficult to design shielded dynamic shimming coils with a sufficient strength and acceptable switching characteristics.

Decomposing or parcellating the volume of interest into smaller sub-volumes for shimming was theoretically demonstrated to significantly improve the magnetic field homogeneity compared to multi-slice techniques {22}. It was suggested that a suitable parcellation approach would use multidimensional excitation to decompose the volume into smaller sub-volumes, although this technique has not yet been realized. A further consideration is the SNR or time penalty associated with parcellation and whether these disadvantages can be accommodated in a clinical MR scan protocol.

There is a fundamental physical reason why parcellation must be performed using smaller, image space sub-volumes and not throughout spatial encoding of a single volume. The received MR signal is the sum over the entire excited and received volume, such that if the local shim is improved over one region of the object, it will deteriorate image quality elsewhere.

Recently, it was shown that field heterogeneity could be corrected in real time using a method of temporal adjustment of frequency swept RF excitation, refocusing and spatial encoding gradients in echo planar imaging (EPI) sequences {6,26,27}. In these methods, a temporal shift of the gradient echo arising from each position in the volume is introduced using frequency swept excitation. The position-dependent gradient echo is corrected for its local frequency offset. In contrast to these techniques, the present invention uses a combined method of nonlinear phase preparation using nonlinear magnetic fields and dynamically adjustable shim magnetic fields together with the spatially encoding magnetic fields (SEMs). The present invention also involves methods to optimize the shim magnetic fields throughout the spatial encoding.

The present invention is also related to a different approach for imaging in the presence of magnetic field inhomogeneity, now commonly referred to as z-shimming {28-31}. Z-shimming involves repeating a measurement one or more times, where each repetition is acquired in the presence of a different offset in the slice-selection gradient. This allows the separately acquired images to have the field inhomogeneities compensated in different regions of the object. The separate images can then be combined by one a number of methods to form the final desired image {31}. The clear disadvantage of z-shimming is that, for a particular desired image, the acquisition of the corresponding desired k-space coverage must be repeated N times, where N is the total number of different z-shim values used. The overall scan time will therefore typically be N times longer than would be needed to acquire the desired image if no extra shimming were required. An embodiment of the invention is particularly practical when the magnetic field heterogeneity arising from a plurality of sub-volumes within the object of investigation is decomposed into a basis set of N orthogonal functions and corrected using M magnet coils whose magnetic fields substantially compensate for the magnetic field heterogeneity of each function within the basis set. It is common for commercial MRI devices to be fitted with magnet coils whose magnetic fields closely approximate such an orthogonal basis set, so by this method the currents required in the magnet coils to compensate the magnetic field heterogeneity within a particular sub-volume are easily calculated.

In another preferred embodiment of the invention at least one field manipulating coil with nonlinear magnetic field distribution, used to generate a nonlinear phase distribution, produces a quadratic magnetic field spatial distribution of the form $(x^2+y^2-2z^2)$, $(x^2-y^2)$ or $(2xy)$ where x, y and z are the coordinates used for primary spatial encoding of the generated transverse magnetization. In this embodiment a quadratic field modulation is induced within the volume of transverse magnetization. Quadratic phase distribution has an advantage of introducing linear relationships between the position within the object of investigation and the shifts of k-space signals, resulting in an efficient control of temporal separation of the signals generated from different sub-volumes within the object of investigation. Another advantage of the fields of the form $(x^2+y^2-2z^2)$, $(x^2-y^2)$ or $(2xy)$ where x, y and z are the coordinates used for primary encoding is that these fields can be efficiently generated by magnetic field manipulating coils with geometry similar to those presently used for shimming. In a practical implementation existing designs of dynamic second-order shim systems may be employed.

Another embodiment of the invention involves preparing a 2D nonlinear phase distribution and a 2D primary spatial encoding, but the same technique can be applied with the same advantages with preparing a 3D nonlinear phase distribution and/or a 3D primary spatial encoding.

Another embodiment of the invention involves performing primary spatial encoding using significantly nonlinear encoding fields as the SEMs. The non-linearity can have a degree such that ambiguous encoding might result, which can still be resolved with the additional encoding capabilities provided by multiple receiver channels. In spite of the nonlinear nature of the primary spatial encoding, which is likely to be advantageous in several applications, it is still possible to temporally separate the signals and thus use dynamic shim updating for intra-slice shimming. The advantages that the presented invention has with standard primary spatial encoding are still valid when nonlinear SEMs are used for primary spatial encoding.

Another embodiment or variant of the invention is a method where one or more spatially varying magnetic fields which are variable in time are applied simultaneously during transmission of the RF pulse or pulses in step (C) of the independent claim. The embodiment involves the use of spatially varying magnetic fields (linear or nonlinear), which are constant in time, applied simultaneously during transmission of the RF pulses to produce transverse magnetization in the conventional manner. A different approach would be to apply spatially varying magnetic fields which are variable in time simultaneously during transmission of the RF pulses. This would allow the benefits of the invention to be exploited alongside the extra degrees of freedom in the form of the resulting transverse magnetization.

In another embodiment or variant of the invention a particularly advantageous aspect of the present invention can be utilized when the non-linear phase distribution generated in step (AA) is reverted in an additional step (CC) which follows the MR signal data acquisition step. Step (CC) is essential for imaging methods sensitive to the entire phase evolution between the consecutive repetitions the MR sequence or its parts. For example for balanced steady state free precession (bSSFP) sequence it is essential that the total phase induced during the time interval between the consecutive RF pulses is set to a desired value (typically 0 or 180 degrees). Imaging methods based on the bSSFP sequence are very sensitive to field inhomogeneities and have a potential to benefit most from the present invention. Other sequence classes, as for example rapid acquisition with relaxation enhancement (RARE), also impose constraints on the total phase accumulation during specific sequence cycles. Introduction of step (CC) makes it possible to use the proposed innovative dynamic methodology in combination with such sequences.

In another preferred embodiment or variant of the invention an additional spatial localization of the MR signals occurs by means of using receiver coil arrays consisting of multiple receiver coils with different localized sensitivities. This additional means of signal localization can be employed to either relax requirements on the applied non-linear phase modulation or to reduce the total acquisition time by skipping some of the steps of primary spatial encoding and employing some of the known parallel imaging reconstruction methods like SENSE, GRAPPA, or alike.

Another embodiment or variant of the invention is also compatible with a majority of the MR imaging methods known to date. Specifically conventional imaging sequences, for example, gradient echo, spin echo, fast low angle shot (FLASH), fast spin echo (FSE, also known as turbo-spin echo, TSE or RARE), echo planar imaging (EPI) or combination of the above or related methods may be employed in step (C). Additionally, magnetic resonance spectroscopy techniques, for example, chemical shift imaging (CSI), can also be used to generate image or spectroscopic data in step (C), with a particular advantage in the improvement of the spectral resolution of the signals.

Another embodiment or variant of the invention has an important feature: The proposed dynamic shimming strategy can be combined with a plurality of known signal encoding and readout strategies, for example, Cartesian, radial or spiral spatial encoding strategies. Thus the desired k-space coverage and k-space trajectory can be defined based on the particular application needs (e.g. speed, temporal resolution, robustness, etc), independently of the dynamic shimming requirements. This embodiment is therefore a method, wherein one among a plurality of established spatial encoding strategies are used for acquisition of MR data, in particular Cartesian, radial or spiral spatial encoding strategies.

In other preferred embodiment or variant of the invention, the transverse magnetization generated by the preceding RF pulse or pulses can be encoded several times using primary spatial encoding magnetic fields to generate several MR echoes, which can be reordered into single- or multi-shot acquisitions. It is important to note that different echoes may in principle be affected by different shim settings provided the shim system is capable of sufficiently fast updates. This embodiment is therefore a method, where MR echoes are reordered in single- or multi-shot acquisitions.

Another embodiment or variant of the invention involves a method to suppress undesired signals by post-processing. Artifacts associated with nonlinear phase preparation include oscillations of reconstructed signal data such as Gibb's ringing. The benefit of post-processing of the acquired data is that it enables effective suppression of these artifacts. There are numerous post-processing methods that can be used to suppress artifacts. Among them is signal filtering by applying a window filter to the data.

Another preferred embodiment or variant is a method where each sub-volume defined for the determination of the dynamically updated shimming parameters is chosen as the localized sub-volume which predominately contributes signal to the acquired data of a shot, or a set of shots, of a multi-shot imaging sequence, where a shot is defined as the time between the beginning of each excitation RF pulse train and the end of the corresponding data recording. The advantage of this embodiment is that shimming parameters need to be updated only once or less per shot, making the sequence less demanding for shim hardware performance. The term "predominately" refers to the fact that the spatial frequency energy of the object is not focused exactly at zero frequency. However, most of the energy of the signal is concentrated at very low spatial frequencies. This issue and related effects have been analyzed in detail in {40} and therefore the term "predominately" must be interpreted in view of the publication {40}.

Another preferred embodiment or variant is a method where each sub-volume defined for the determination of the dynamically updated shimming parameters is chosen as the localized sub-volume which predominately contributes signal to a subset of the acquired data of a single-shot imaging sequence or to a subset of acquired data of an individual shot of a multi-shot imaging sequence. One advantage of this embodiment is that the shimming parameters can be updated for smaller sub-volumes. Another advantage is that dynamic shim updating is also feasible for long readouts.

Another embodiment or variant of the invention involves an algorithm to estimate the currents in the time-varying magnetic field manipulation coils used to homogenize the magnetic field. The algorithm includes a linear regression to minimize the homogeneity from multiple locations within the object. The advantage of the algorithm is that it minimizes the field homogeneity in the at least one sub-volume of the object of investigation. This has the advantage over other methods in that it enforces homogeneity over one or more sub-volumes that may simultaneously contribute to the acquired signal data. The invention also includes methods to constrain the solutions of the linear regression or enforce smoothness by regularization. The advantage of these methods is that they allow for solutions which are physically realizable using hardware, minimize artifacts associated with rapid magnet coil switching and converge on stable solutions for when the least-squares problem is underdetermined. In this category of embodiments or variants of the invention fall three different methods:

a) Method, wherein the time-varying current in field manipulation coils $\beta'(t)$ in the dynamic shim updating step is determined using a calculation to minimize the homogeneity from multiple locations within the object in accordance with a minimization algorithm, e.g. $\beta'(t)=\min_\beta \|x-X\beta(t)\|_2^2$ wherein:
$\beta'(t)$ is a vector of time-varying currents in shim magnet coils
x is a vector of uncorrected magnetic fields at multiple locations within the object of investigation
X is a particular basis function of spatial coordinates, e.g. spherical harmonics.

b) Method, wherein the time-varying current in the magnet coils $\beta'(t)$ in the dynamic shim updating step is determined using a calculation to minimize the homogeneity from multiple locations within the object in accordance with a minimization algorithm, e.g. $\beta'(t)=\min_\beta \|x-X\beta(t)\|_2^2$, possibly subject to additional constraints, e.g.

$$\frac{d\beta'}{dt} < \alpha_1 \text{ or } |\beta'| < \alpha_2.$$

wherein:
$\beta'(t)$ is a vector of time-varying currents in shim magnet coils
$\alpha_{1,2}$ are constraint parameters
x is a vector of uncorrected magnetic fields at multiple locations within the object of investigation
X is a particular basis function of spatial coordinates, e.g. spherical harmonics.

c) Method, wherein the time-varying current in the magnet coils $\beta'(t)$ in the dynamic shim updating step is determined using a calculation to minimize the homogeneity from multiple locations within the object in accordance with a minimization algorithm, e.g. $\beta'(t)=\min_\beta \|x-X\beta(t)\|_2^2+l\|\beta(t)\|_2^2$ wherein:
$\beta'(t)$ is a vector of time-varying currents in shim magnet coils
$\alpha_{1,2}$ are constraint parameters
x is a vector of uncorrected magnetic fields at multiple locations within the object of investigation
X is a particular basis function of spatial coordinates, e.g. spherical harmonics
l is a Tikhonov regularization parameter.

In the accompanied drawings, which are incorporated in and constitute a part of this specification, embodiments of the invention are illustrated, which together with a general description given above, and the detailed description given below, serve to exemplify the essential principles of the invention. It will be appreciated, that those skilled in the art will be able to devise various arrangements that, although not explicitly described or shown herein, embody the principles of the invention and are included within its scope. Furthermore, all examples are to be construed as being without limitation to such specifically recited examples and condi-

DESCRIPTION OF THE PREFERRED EMBODIMENT

Figure 1:
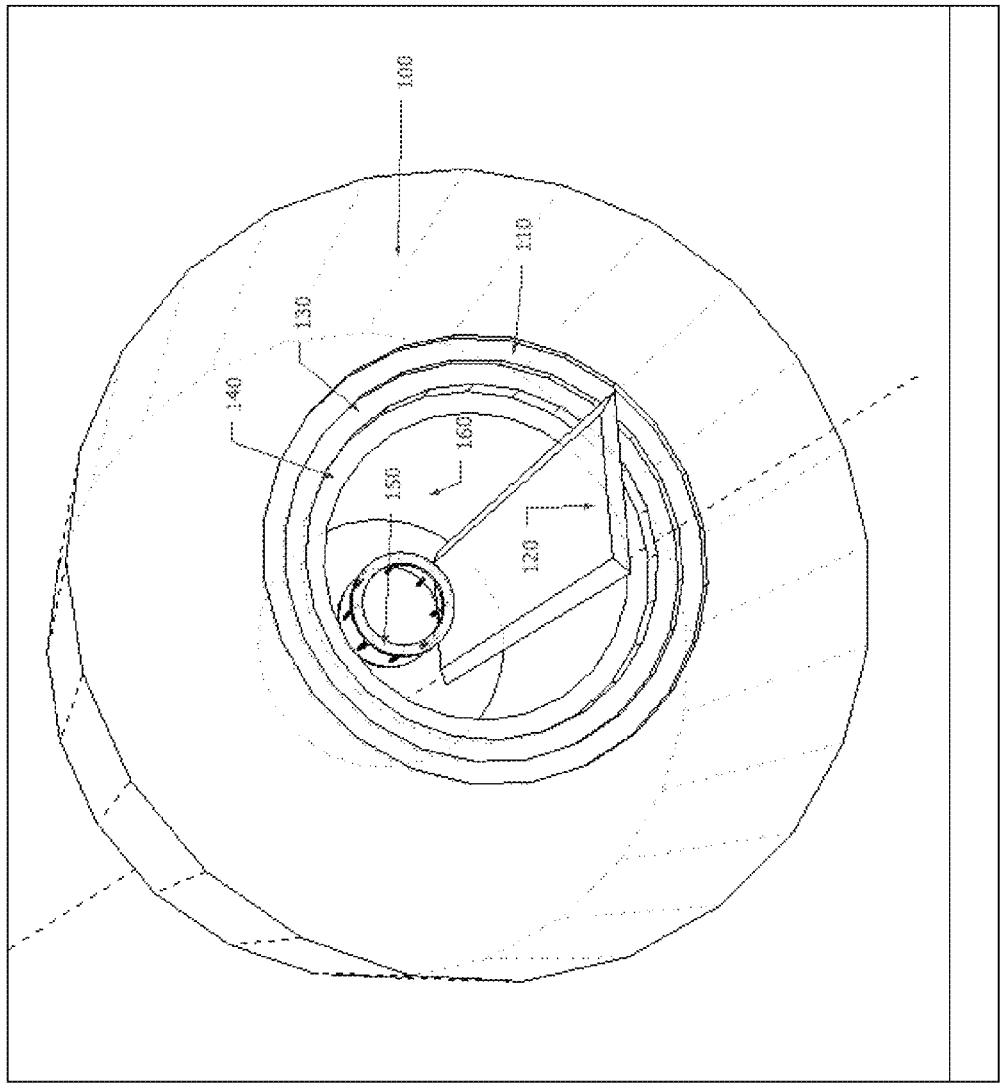
FIG. 1 is a diagram showing the construction of an magnetic resonance imaging device including the magnet, spatial encoding magnet coils, shim magnet coils and nonlinear magnet coils along with the bed and RF coil.

FIG. 1 is an illustration of a main magnet 100 of a nuclear magnetic resonance device with an axial 170 room temperature bore 160. The arrangement of the bore 160 is such that the operating component of static magnetic field encompasses the radiofrequency coil 150, which is used to deliver radiofrequency pulses to excite a transverse magnetization within an object of investigation, e.g. a human subject, who lies on the bed 120. The bed 120 is suspended near center of the concentric part of the bore 160, such that the object of investigation lies directly in the radiofrequency coil 150. The illustration of the RF coil 150 is a 'birdcage' style coil, although it is well known that other geometries, sizes or a plurality of RF coils may be used to generate a transverse magnetization. There are many common configurations of nuclear magnetic resonance devices, e.g. the bore 160 may lie in a vertical direction. The main magnet 100 may consist of resistive conducting elements or superconducting elements. In the situation where the main magnet 100 consists of superconducting elements, the superconducting magnet consists of a plurality of superconducting coils (not shown) in a helium pressure vessel (not shown) within a vacuum vessel (not shown) to provide the magnetic field. In a set of concentric rings surround the bore 160, are placed shim magnet coils 110 that generate several magnetic field gradients of different spatial configurations, primary magnet coil gradients 130 that are also called spatial encoding magnetic fields (SEMs), and a magnet coil producing a substantially nonlinear magnetic field 140. Arranged in a concentric configuration between the shim magnet coils 110 and the main magnet 100 are placed a set of sliding rails upon which are placed passive magnetic shim devices (not shown). Various other elements such as covers, supports, suspension members, end caps, brackets, etc. are omitted from FIG. 1 for clarity.

Figure 2:
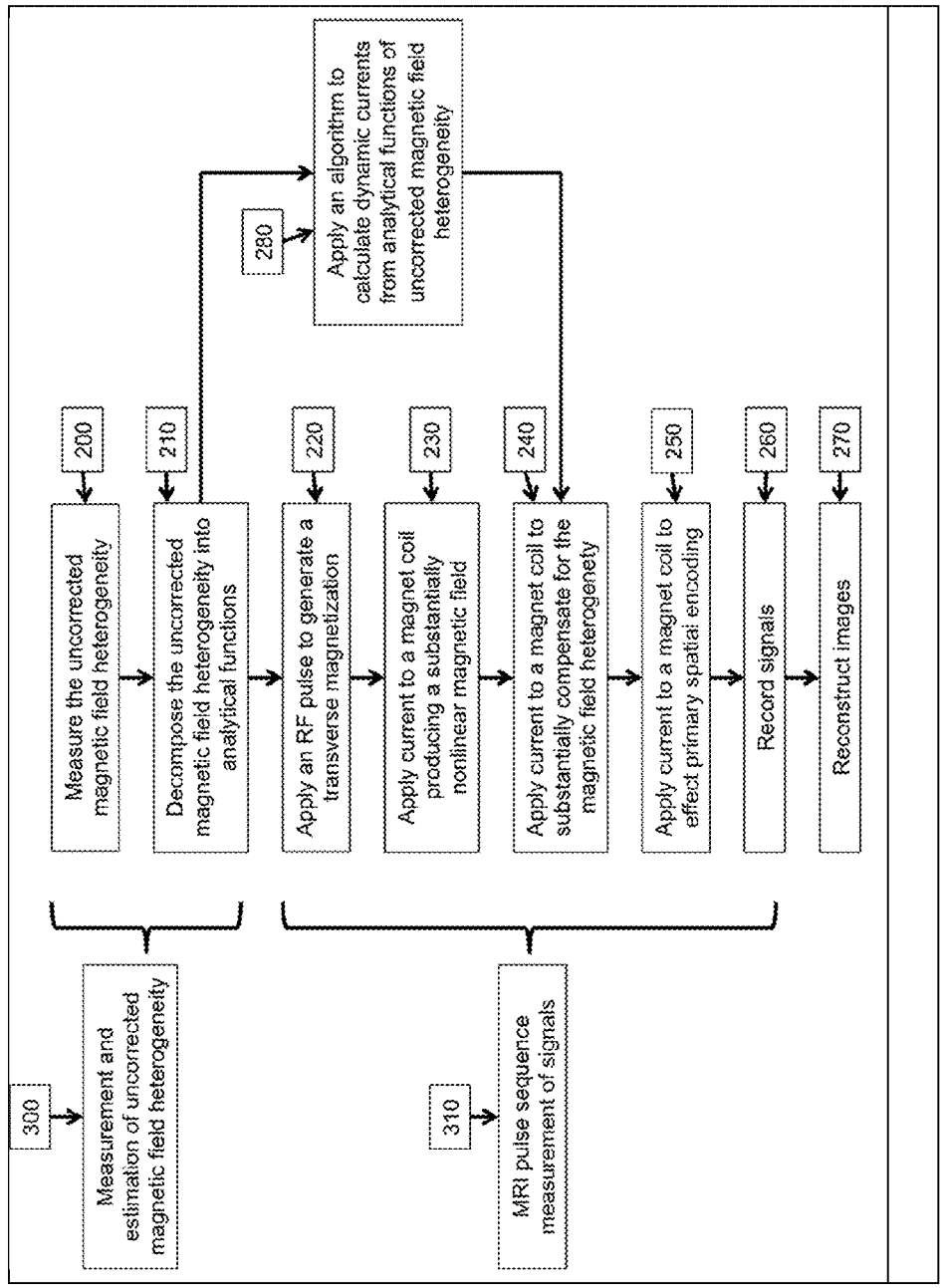
FIG. 2 is a block diagram showing the algorithm used to dynamically compensate for the magnetic field homogeneity.

FIG. 2 is a schematic block diagram of magnetic resonance imaging control system, which is interfaced to the main magnet 100, radiofrequency coil 150, bed 120, SEMS 130, nonlinear magnetic field 140, and shim magnet coils 110. The control of the MRI system 36 is through an operator console 15 including an input device 17 such as a keyboard, mouse, trackball, touch activated screen, light wand, voice control, or any similar or equivalent input device for geometry prescription and a display unit 16 such as a monitor. The console 15 communicates through a link with a computer system 11 and provides an interface for the operator to set up MRI scans, protocol parameters, prescribe image slice orientations, perform image processing and archiving of MR images. The computer system 11 consists of several modules that communicate with one another through links, such as an Ethernet cable or fiber optic connections or wireless communications. The modules of the computer system 11 consist of an image processor module 14, CPU module 12, memory 13, which may include a buffer for storing image data arrays. In another MRI system, the image processor module 14 may be replaced with an image processing functionality on the CPU module 12, The computer system 11 may also be connected to devices for archiving media such as permanent hard disks for memory storage or a network (not shown). The computer system may also connect to a system control computer 18 through a link.

The system control computer 18 includes a set of modules in communication with one another via a linking system. In an alternative embodiment, the modules of the computer system 11 and the system control computer 18 may be implemented on the same computer system or a plurality of computer systems. The modules of the system control computer 18 may include a CPU module 24 and a pulse generator module 22. In another embodiment, the pulse generator module 22 may be integrated with the magnet system 36. Through a link between the system control computer 18 and the computer system 11, the system control computer 18 receives instructions to perform the scan and how the scan is performed. The pulse generator module 22 performs a series of pulse sequences by sending a set of commands or requests (e.g. RF waveforms), which describe the timing, length and amplitudes or shapes of the RF pulses and pulse sequences to be produced and the timing and length of the data acquisition window. The pulse generator module 22 also connects to a gradient amplifier system 35 and produces gradient data waveforms, which control the timing and shape of the gradient pulses that are to be used during the scan. The system control 18 will also receive patient data form the physiological acquisition controller 31 that may receive signals from a plurality of receiver systems that are connected to a patient, such as ECG signals from electrodes attached to the patient. It is also through the scan room interface 29 that a patient positioning system 28 receives commands to move the patient table to the desired position for the scan.

The gradient waveforms generated by the pulse generator module 22 are applied to the gradient amplifier system 35 that is comprised of three distinct gradient systems, the spatial encoding magnetic field amplifiers 32, the nonlinear magnetic field amplifiers 33, and the dynamic shim amplifiers 34. Each gradient amplifier amplifies a signal from the pulse generator 22 to generate amplified signal waveforms on the gradient magnet systems on the magnet 36. In this way, the spatial encoding magnetic field amplifiers are linked to the SEM coils 130, the nonlinear magnetic field amplifiers are connected to the nonlinear magnetic fields 140, and the dynamic shim amplifiers are connected to the dynamic shim magnetic fields (not shown). The transceiver module 21 receives instructions from the pulse generator 22 to produce RF signals that are amplified on the RF amplifier 25. These RF signals are passed through a transmit and receive gating apparatus (T/R Switch) 27 that allows for high amplitude RF signals to be transmitted, but at different times, for low amplitude RF signals to be received from the RF coil 150 in the magnet system 36. The resulting signals emitted from nuclei within the patient are detected by the RF coil 150 and coupled to the T/R switch 27 to be passed through a preamplifer 26. The T/R switch 27 may also enable a separate RF coil such as a parallel transmit or receive or surface coil to be used in either the transmit or receive modes.

The MR signals sensed by the RF coil 150 are digitized by the transceiver module 21 and transferred to a memory module 66 in the system control computer 18. Usually, the frames of data that originate from the MR signals are stored temporarily in the memory module 23 until they are transformed to generate images. An array processor 19 uses a transformation method such as the Fourier transform or the Radon transform to create MR images from the acquired signals. These images are transferred to the computer system 11 for archiving and displayed to the operator 16 for further processing or analysis.

Figure 3:
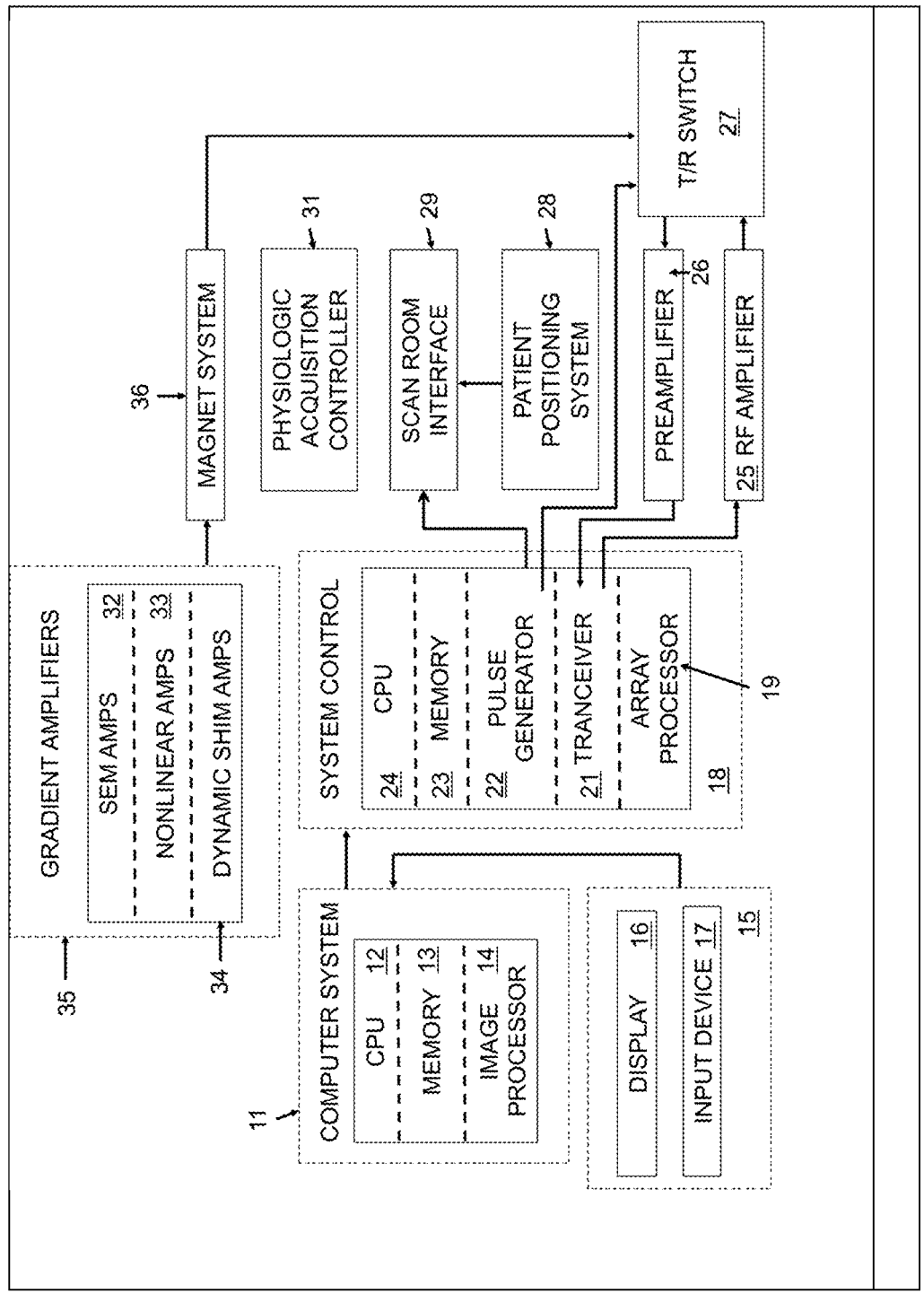
FIG. 3 is a block diagram showing the overall construction of the MRI device.

A schematic block diagram depicting the method using a preferred embodiment of the invention is shown in FIG. 3. Initially a measurement of the uncorrected magnetic field heterogeneity is performed using one of several methods 200. In a second step 210, a transverse magnetization is generated within the object of investigation using a radiofrequency coil 150. The steps 200 and 210 combined constitute a single preliminary step, which is used to measure and quantify the magnetic field heterogeneity.

In general, a pulse sequence 310, which encompasses steps 220, 230, 240, 250 and 260, is some particular combination of radiofrequency pulses and magnetic field gradients, which are pulsed in a well-defined fashion, with various combinations of the RF pulse phases, gradient amplitudes and durations, with particular sequence timing and are repeated until the MRI process is completed. It should be appreciated that there are a near limitless combination of RF pulse and gradient pulse timings that can be used to obtain the desired contrast of the reconstructed image of the object of investigation. Because of the diversity and limitless range of pulse sequence parameters (e.g. repetition time TR, echo time TE, RF pulse amplitude or flip angle), it is also possible to integrate the measurement of the magnetic field homogeneity 300 with the image acquisition process 310 to obtain a "real-time" measurement of the field heterogeneity.

In the first step of the MRI acquisition process 310 an RF pulse is applied to generate a transverse magnetization 220. This RF pulse may have amplitude and phase dependence and be delivered on a plurality of RF transmitters to generate the transverse magnetization. In the second step of the MRI acquisition process 310, a nonlinear phase distribution within the transverse magnetization is created by delivering currents to at least one magnet coil producing a significantly nonlinear magnetic field profile. In a third step 240, currents are applied to a second set of magnet coils to substantially compensate for the magnetic field heterogeneity. The currents delivered to the magnet coils in step 240 are determined by applying an algorithm on the analytical functions of the measured uncorrected magnetic field homogeneity 280. In a fourth step 250, primary spatial encoding is performed using a third set of magnet coils to effect primary spatial encoding on the object. In a fifth step 260, the signals are recorded from one or more RF receiver coils, amplified and digitized for storage on a computer. In a final step 270, these digitized signals are reconstructed into an MR image using one of several image reconstruction techniques or transformations.

In one common method of measurement of the uncorrected magnetic field heterogeneity 200, the magnetic field profile is estimated using gradient echo MRI pulse sequence measurement and post-processing of the MR signal phase data as described in {32,33}. This sequence is repeated with at least two echo times (e.g. TE=2.25, 2.5, 2.75, and 3 ms for a maximum, unaliased frequency measurement of 4000 Hz).

Maps of the magnetic field $B_0$ are computed using software. Using this approach, MR phase data $\phi$ are unwrapped along the temporal dimension to remove aliasing. A field map is computed by minimizing the pixelwise $L^2$ norm (linear least-squares solution)

$$\beta' = \min_\beta \|y - X\beta\|_2^2 \quad [1]$$

Where the 2×N vector $\beta$ consists of column elements of the frequency offset $\Delta\omega = \gamma B_0$, measuring the departure of the magnetic field $\Delta B_0$ from homogeneity, $$\beta = \begin{bmatrix} \Delta\omega_1 & \ldots & \Delta\omega_N \\ \phi_1 & \ldots & \phi_N \end{bmatrix} \quad [2]$$

$N=N_x N_y N_z$ is the total number of voxels, X is an $N_{TE} \times 2$ coefficient matrix $$X = \begin{pmatrix} TE_1 & 1 \\ \ldots & \ldots \\ TE_{N_{TE}} & 1 \end{pmatrix}, \quad [3]$$

and y is an $N_{TE} \times N$ matrix of unwrapped phase data.

In another method of measuring the uncorrected magnetic field distribution, the field is measured using at least one magnetic field probe in a number of locations. The field values are recorded in a computer program that determines the spatial distribution of the magnetic field.

Figure 4:
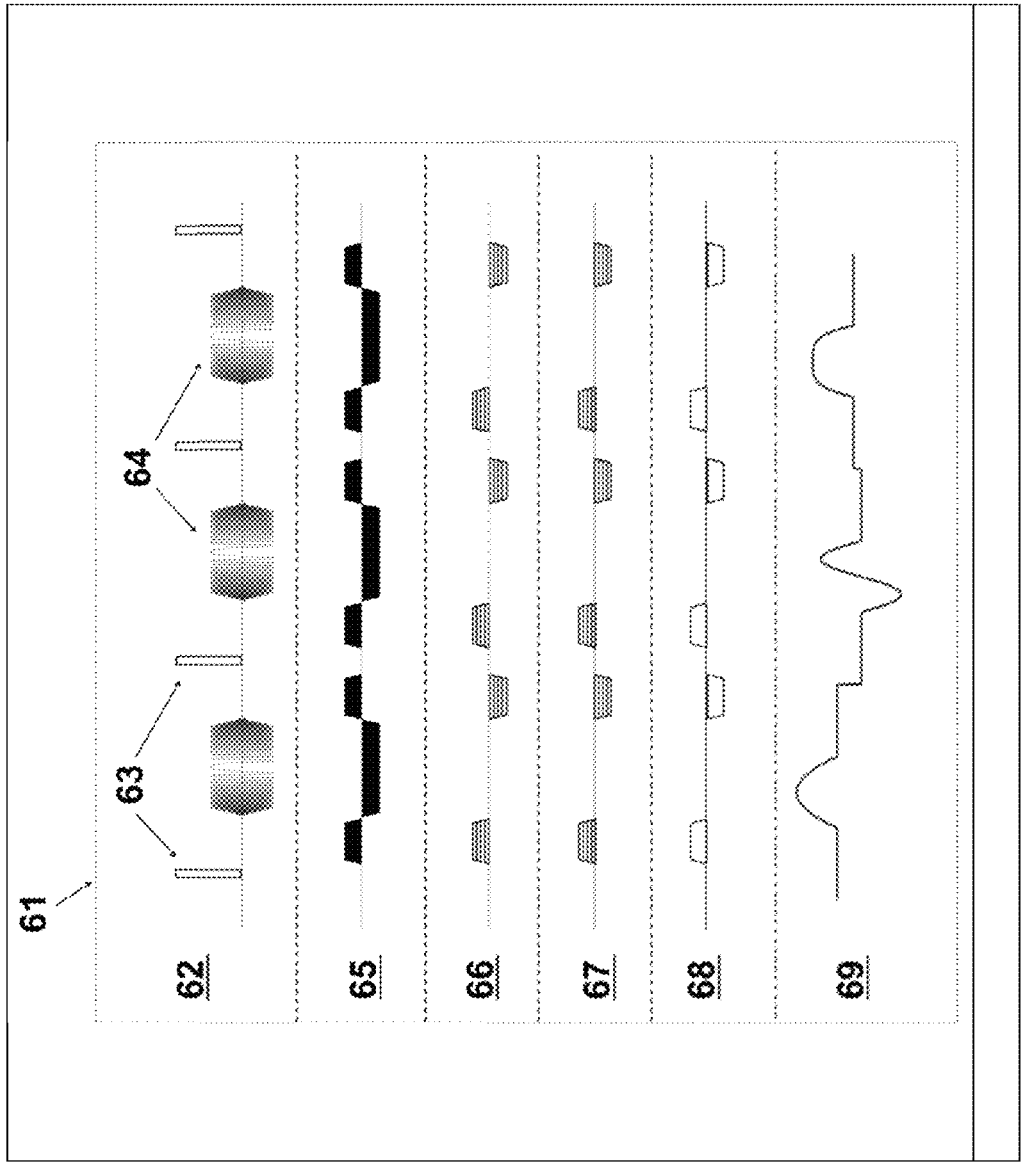
FIG. 4 is an MRI pulse sequence that schematically depicts waveforms delivered to MRI hardware according to one embodiment of the invention.

FIG. 4 is a preferred embodiment of the pulse sequence 310 that is controlled by the operator on the computer system 11 and produced on the pulse generator and transceiver to control the timing and durations and shapes of all RF pulses and magnetic fields on the magnet system 36 to obtain MR signals corresponding to 310. The MRI pulse sequence 61 consists of RF and ADC 62 and gradient pulse waveforms 65, 66, 67, 68 and 69. In one embodiment, a series of rectangular RF pulses 63 are applied that nonselectively excite all nuclei within the object of investigation. In another embodiment, the rectangular RF pulses 63 may be replaced with shaped pulses (not shown) or shaped pulses and magnetic field gradients (not shown) to selectively excite nuclei within the bandwidth of the RF pulse corresponding to a range of frequencies such as a limited view of the object of investigation or a particular set of chemical frequencies within the object of investigation. Following the RF pulses 63 signal acquisition occurs 64 where the nuclear signals are converted into electronic signals via the RF coil 150 and these signals are ultimately stored in memory 23 on the system control computer 18. Spatially encoding magnetic (SEM) fields are applied on three orthogonal axes with orientations, for example, directed along X 65, Y 66 and Z 67. The SEM fields cause nuclei at particular locations within the object of investigation to accumulate a particular signal phase or have a particular signal frequency corresponding to their position within the object of investigation. To create image from data acquired in the presence of a SEM field, a suitable number of the RF pulses 63, acquisitions 64, and modulated SEM fields must be applied to spatially encode the nuclei for reconstruction. The relationship between SEM fields producing an arbitrary geometric profile and the acquired signal is given by ref. {34}. In addition, a nonlinear magnetic field 68 generating a nonlinear phase within the object of investigation is delivered following the excitation of nuclei by the RF pulses 63 and prior to acquisition 64 is applied. In another embodiment, the nonlinear magnetic field may be applied during the acquisition 64. Finally, currents are applied to a dynamic shim magnetic field 69 to dynamically homogenize the magnetic field within the object of investigation. Currents delivered to the dynamic shim magnetic field 69 are calculated from the algorithm 280, wherein the uncorrected magnetic field heterogeneity is corrected.

It will be appreciated by those skilled in the art that the particular combination of RF pulses 63, acquisition steps 64, and currents delivered to SEM magnetic fields and nonlinear magnetic fields is limitless and is usually tailored to obtain a particular image type or contrast within the object of investigation. In another embodiment, a single RF pulse may be applied and currents may be applied repeatedly to SEM magnetic fields to spatially encode the nuclei to enhance the speed of acquisition. In another embodiment, currents are applied to only 1 or 2 of 3 orthogonal SEMs 65, 66, 67 to obtain 1 or 2-dimensional views of the object of investigation. In another embodiment, a multi-slice acquisition is performed consisting of several 2-dimensional views within the object of investigation.

For the preferred embodiment, in the presence of field heterogeneity, nonlinear phase preparation, and DSU, the MR signal is represented mathematically, following RF excitation of the nuclei 63 as $$S(k,x) = \int_{-\infty}^{\infty} \rho(x) m(\Delta\omega_k(x)) e^{i[kx - \Delta\omega_0(x)\tau + \Delta\omega_k(x)\tau + \phi(x)]} dx \quad [4]$$

where $\rho(x)$ is the object's nuclear concentration (spin density), m is response of the nuclei to the particular sequence of RF and magnetic field pulses, $\Delta\omega_k - \Delta\omega_0$ is the current magnetic field profile during the acquisition of spatial frequency k and $\omega(x)$ is the particular nonlinear phase preparation applied. Each spatial frequency k is given by the moment of the SEM fields $$k = \gamma \int_{\tau_0}^{\tau-\tau_0} B(x,t) dt \quad [5]$$

The spatial frequencies k are therefore related to the time integral of the spatially-varying SEM field B(x,t) and the gyromagnetic ratio, $\gamma$, which is determined by the properties of the nuclei under investigation.

The dynamic shim magnetic field may be represented as linear combination of available spherical harmonic magnetic fields, which are represented as a combination of Legendre polynomials $Y_l^m$ and which may depend on the acquired spatial frequency k $$\Delta\omega_k(x) = \gamma B_{l,m} = \gamma \sum_{l,m} Y_l^m(\theta, \phi) \quad [6]$$

Figure 5:
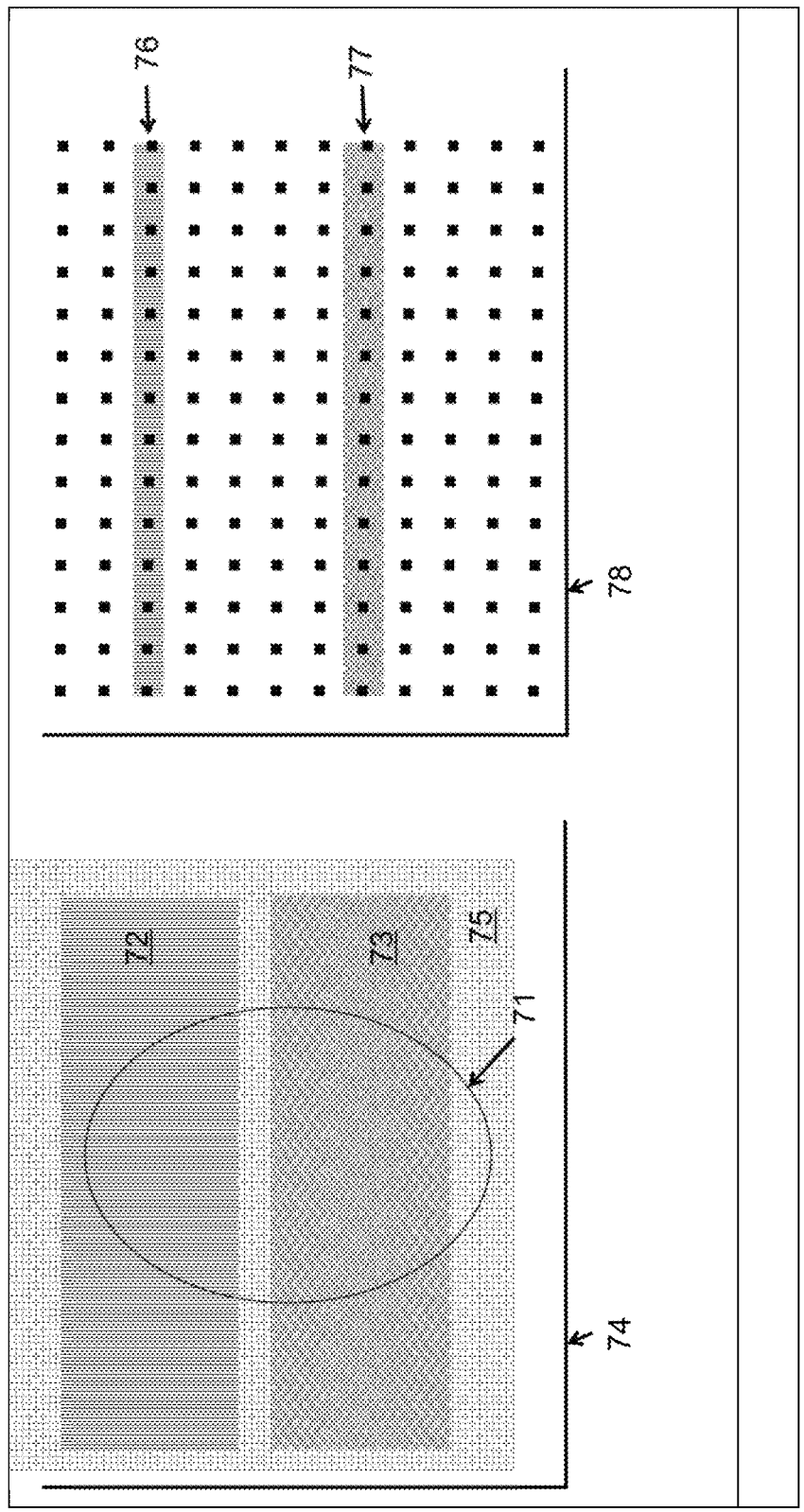
FIG. 5 is a diagram showing schematically the arrangement of signals and image data in the algorithm to determine the time-varying currents in the shim magnet coils according to one embodiment of the invention.

In one embodiment, an algorithm 280 is used to estimate the time-varying currents delivered to the field manipulation coils 240. FIG. 5 shows schematically how the currents delivered to the dynamic shim magnet coils 240 are calculated from analytical functions of the uncorrected magnetic field profile 210. An algorithm 280 is used to estimate the adjustment magnetic field currents to correct the magnetic field within one or a plurality of sub-volumes $V_k$ 72 of the uncorrected magnetic field homogeneity image 74 of the object of investigation 71. In this method, a sub-volume $V_k$ 72 with a size of N voxels is selected from the image of the uncorrected magnetic field homogeneity 74. In the presented embodiment, the desired k-space coverage is rectangular with a regular, Cartesian sampling grid 78. In the presented embodiment, for one line of acquired spatial frequencies k 76, the same sub-volume 72 is used for the algorithm. For a different set of spatial frequencies k 77 a different sub-volume 73 is chosen. The particular choice of sub-volume for each set of spatial frequencies is determined by the amplitude and shape of the nonlinear magnetic field 240 as will be discussed below.

The algorithm 280 consists of a linear regression to determine the time-varying currents in the field manipulation coils. The coefficient matrix $\beta_k$, which is related to the dynamic shim magnetic field currents by the resistance, is determined using a linear least-squares approach in a fashion similar to ref. {32}. The coefficient matrix $\beta_k$ is calculated as follows: first, an N×3 matrix X containing the positions of each voxel r, e.g. in 2-dimensions r=[x, y], where r∈$V_k$, is constructed, so $$X = \begin{pmatrix} 1 & x_1 & y_1 \\ \cdots & \cdots & \cdots \\ 1 & x_n & y_n \end{pmatrix}. \quad [7]$$

Then, the uncorrected magnetic field profile 300 is passed to the parcellation algorithm to form the N×1 matrix y and the chosen frequencies $\Delta\omega(r)$ where also r∈$V_k$ $$y = \begin{pmatrix} \Delta\omega_1 \\ \cdots \\ \Delta\omega_N \end{pmatrix}. \quad [8]$$

Finally, the least squares solution $\beta_k'$ is found by $$\beta_k' = \min_{\beta_k} \|y - X\beta_k\|_2^2 \quad [9]$$

Figure 6:
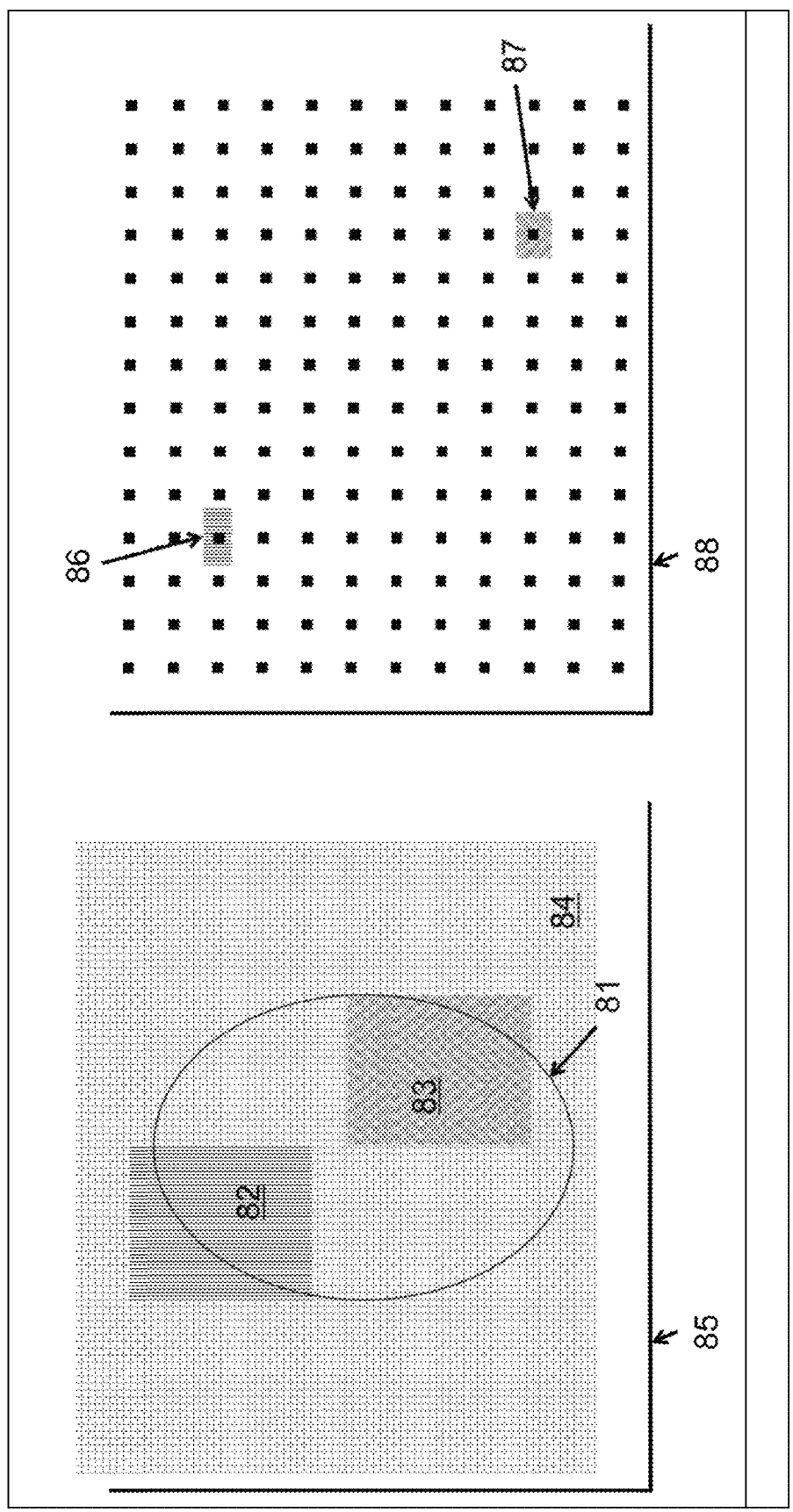
FIG. 6 is a diagram showing schematically a second arrangement of signals and image data in the algorithm to determine the time-varying currents in the shim magnet coils according to one embodiment of the invention.

In another embodiment, an algorithm 280 is used to estimate the currents delivered to the dynamic shim magnet coils 240. FIG. 6 shows schematically how the currents delivered to the dynamic shim magnet coils 240 are calculated from analytical functions of the uncorrected magnetic field profile 210. The algorithm 280 is used to estimate the adjustment magnetic field currents to correct the magnetic field within one or a plurality of sub-volumes $V_k$ of the uncorrected magnetic field homogeneity image 84 of the object of investigation 81. In this method, a sub-volume $V_k$ 82 with a size of N voxels is selected from the image of the uncorrected magnetic field homogeneity 84. For one spatial frequency k 86, one corresponding sub-volume 82 is used for the sliding window point parcellation algorithm. For a different spatial frequency k 87 a different sub-volume 83 is chosen. The currents $\beta_k$ applied to the dynamic shim magnetic fields are determined by linear regression as described above.

Figure 7:
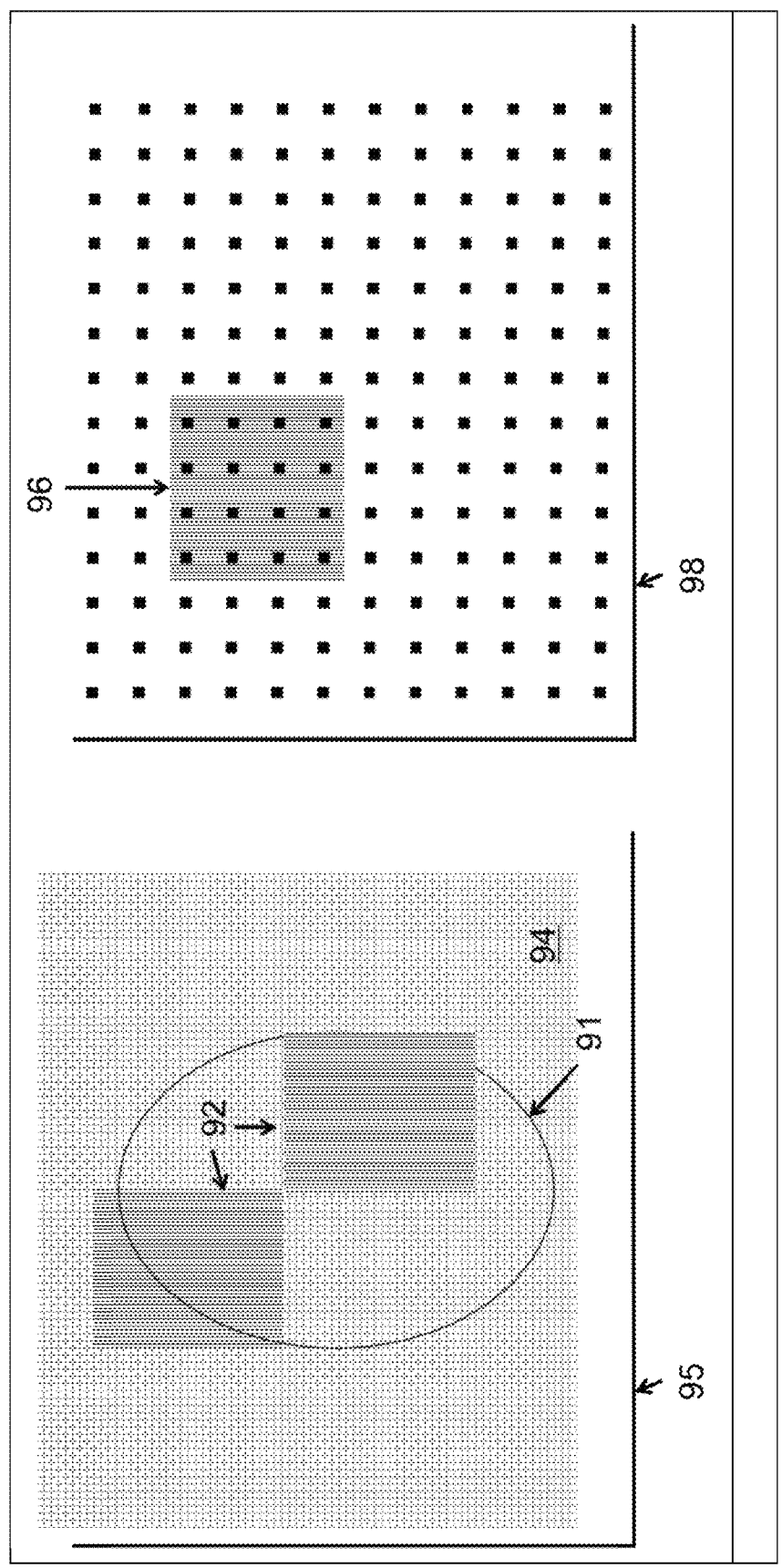
FIG. 7 is a diagram showing schematically a third arrangement of signals and image data in the algorithm to determine the time-varying currents in the shim magnet coils according to one embodiment of the invention.

In another embodiment, another parcellation algorithm 280 is used to estimate the currents delivered to the dynamic shim magnet coils 240. FIG. 7 shows schematically how the currents delivered to the dynamic shim magnet coils 240 are calculated from analytical functions of the uncorrected magnetic field profile 210. In this method, two disjoint sub-volumes $V_k$ 92 with a total size of N voxels are selected from the image of the uncorrected magnetic field homogeneity 84. For a set of spatial frequencies k 97, the currents $\beta_k$ applied to the dynamic shim magnetic fields are determined by linear regression as described above. It will be appreciated by those skilled in the art that for any set of spatial frequencies k a corresponding volume $V_k$ of varying size, dimensionality and shape could be selected from the image of the uncorrected magnetic field profile 210. Therefore, for each algorithm there are a large set of parameters that can be optimized to obtain the best corrected magnetic field homogeneity for each spatial frequency k.

It should be observed that in some cases the least-squares solution does not converge on physically realizable currents. In other cases the rate at which these currents change occurs with such rapidity that the hardware cannot tolerate the change. In other cases, coils switched too rapidly will cause artifacts in the reconstruction. In these cases it is necessary to perform the least squares solution $$\beta_k' = \min_{\beta_k} \|y - X\beta_k\|_2^2 \quad [10]$$

subject to two constraints $$\gamma \frac{d\beta_{k_y}'}{dk_y} < \alpha_1 \quad [11]$$

$$\gamma |\beta_{k_y}'| < \alpha_2 \quad [12]$$

Here, $\alpha_{1,2}$ are constraints on the total magnetic field amplitude and time rate of change of the magnetic field amplitude. To impose Eq. [17a], an iterative approach is currently used, i.e. the current magnetic field adjustment is used to constrain the following adjustment.

It should be observed that in some cases the least-squares solution is ill-posed or underdetermined. In these cases it is necessary to perform the least squares solution subject to additional regularization to enforce smoothness on the underlying solution vector of magnet coil currents. In one method, regularization is performed using Tikhonov regularization $$\beta'(t) = \min_{\beta} \|x - X\beta(t)\|_2^2 + I\|\beta(t)\|_2^2 \quad [13]$$

Here the additional term $I\|\beta(t)\|_2^2$ is the regularization term.

Other embodiments might use a circularly shaped k-space coverage with radial sampling spokes or spiral acquisitions or other desired geometric k-space shapes acquired with appropriate k-space trajectories.

To examine the effect of the nonlinear magnetic field gradient 230 currents delivered to the nonlinear magnetic field gradient 68 on the MRI signal, it is useful to invoke the local k-space framework. Local k-space was previously introduced to design a useful encoding trajectory and its corresponding, spatially varying resolution for objects encoded using a Pat-Loc gradient system {35} and the determination of a particular shape used for multidimensional localization by nonlinear phase preparation {36}, but parallels its meaning to analyze k-space shifts induced by local field heterogeneity {37}.

The signal is phase modulated using a substantially nonlinear magnetic field 33 in step 230. The nonlinear magnetic field introduces a MR signal phase, which may be expanded as a series function:

$$\phi(x) = \phi(x_0) + (x_0 - x)^T \nabla \phi(x_0) + \quad [14]$$

Simplifying this expression by choosing to expand about the origin and ignoring the higher order terms yields $$k_s = \nabla \phi. \quad [15]$$

This last result is called the k-space shift vector and the subscript s (for shift) distinguishes it from the usual spatial encoding vectors; the latter of which are not dependent on position. The total k-vector is the local k-space, which depends on position $$k_l(x,\tau) = k(\tau) + k_s(x) \quad [16]$$

The local k-space framework is a useful mathematical and visualization tool to predict the temporal repositioning of signals arising from the nonlinear magnetic field 230 of MRI signals. This can be understood in the following way: under normal conditions and ignoring object-inherent spatial frequencies MR signal experiences a complete refocusing at k=0, which corresponds to a formation of the global gradient echo. Spatial encoding in MRI is sequential. Therefore, each time-point during the acquisition is related to a k-space position: k=k(t). By the nonlinear phase preparation, the k-space position also has a spatial dependency k=k(x,t). Therefore, the condition of the global echo formation is replaced with a local echo for each position x as k(x,t)=0. Due to the sequential nature of encoding the time-point, when echo formation occurs becomes related to the spatial location of signal origin.to. The nonlinear magnetic field is also related to the MR signal phase through the moment equation $$\phi(x) = \gamma \int_{\tau_0}^{\tau - \tau_0} B(x,t) dt \quad [17]$$

Figure 8:
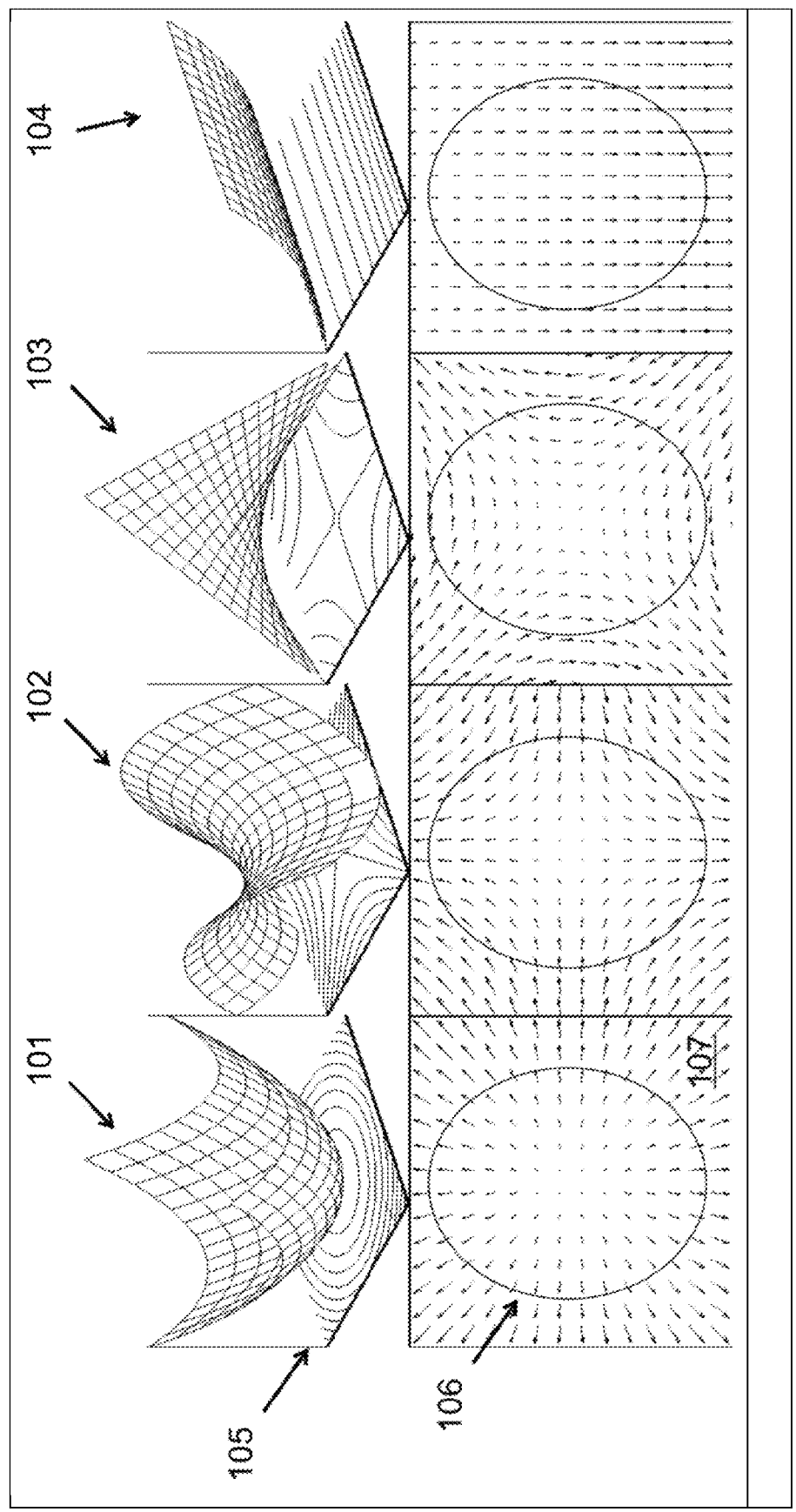
FIG. 8 is a diagram showing schematically the magnetic fields produced by four exemplary magnet coils and the associated MRI signal shift vectors.

FIG. 8 illustrates that the purpose of the nonlinear magnetic field gradient 230 is to impose on the MR signal a considerable spatial dependence. This amounts to a temporal repositioning of signals arising from different locations within the object. The nonlinear magnetic field enables sufficient temporal separation of the signals such that each can be independently homogenized by the dynamic magnetic fields.

In one embodiment, a current is delivered to a 2-dimensional nonlinear magnetic field whose profile is quadratic 101, which for clarity, is also depicted as a 2-dimensional contour plot 105. The quadrupolar magnetic field is described mathematically by the equation $$B(x,y) = x^2 + y^2 \quad [18]$$

Combining Equations 4, 5 and 7, the MR signal or k-space shift vector is $$k_s(x,y,\tau) = 2x\hat{x} + 2y\hat{y} \quad [19]$$

It is depicted as a gradient field 107, which is superimposed on the object of investigation 106.

In another embodiment, a current is delivered to a 2-dimensional nonlinear magnetic field whose profile is quadrupolar 102, which for clarity, is also depicted underneath as a 2-dimensional contour plot analogous to 105. This gradient of this magnetic field that visualizes the MR signal shift is also shown superimposed on the object of investigation.

In another embodiment, a current is delivered to a 2-dimensional nonlinear magnetic field whose profile is also quadrupolar 103, which for clarity, is also depicted underneath as a 2-dimensional contour plot analogous to 105. This gradient of this magnetic field that visualizes the MR signal shift is also shown superimposed on the object of investigation.

It will be appreciated by those skilled in the art that the advantage of the three nonlinear magnetic fields 101, 102, and 103 is that they introduce linear relationships between the object of investigation 106 and the shifted signals $k_s$. Another advantage of the three nonlinear magnetic fields 101, 102, and 103 is that they can also be combined with the dynamic magnetic fields 240.

In another embodiment, a current is delivered to a 2-dimensional nonlinear magnetic field whose profile is an inverse function 102, which for clarity, is also depicted underneath as a 2-dimensional contour plot analogous to 105. The inverse function magnetic field is described mathematically by the equation $$B(x, y) = \frac{1}{x} \quad [20]$$

Combining Equations 4, 5 and 7, the MR signal or k-space shift vector is $$B(x, y) = -\frac{1}{x^2} \quad [21]$$

It will be appreciated by those skilled in the art that the advantage of the inverse magnetic field is that it is somewhat easier to build and integrate with an existing magnet system 36.

It will be appreciated by those skilled in the art that the magnetic fields 101, 102 and 103 or 104 could be combined with the SEM fields or additional linear or nonlinear magnetic fields to shift or change the shape or placement of the nonlinear magnetic field in relation to the object of investigation.

As an example of the foregoing description, for a 1-dimensional quadratic phase preparation along the direction of the phase encoding gradient 66, which for convenience, is oriented along the y-axis.

$$\phi(y) = qy^2 \quad [22]$$

$$k_s(y) = 2qy \quad [23]$$

The acquired MRI signal is the Fourier transform of the spin density function and signal response function $$s(k_y, y) = \int_{-\infty}^{\infty} \rho(y) m(\Delta\omega_{k_y}(y)) e^{i[k_y y + qy^2]} dy \quad [24]$$

The complex Gaussian $e^{ik_y y + qy^2}$ is a particular choice of nonlinear phase preparation, whose coefficient is chosen to maximize the temporal separation of gradient echoes, but without causing significant signal attenuation, $$k_s\left(\frac{L_y}{2}\right) = qL_y = k_{max} \quad [25]$$

This relationship repositions the gradient echo originating from the edge of the field-of-view $L_y$ to the maximally encoded spatial frequency.

Figure 9:
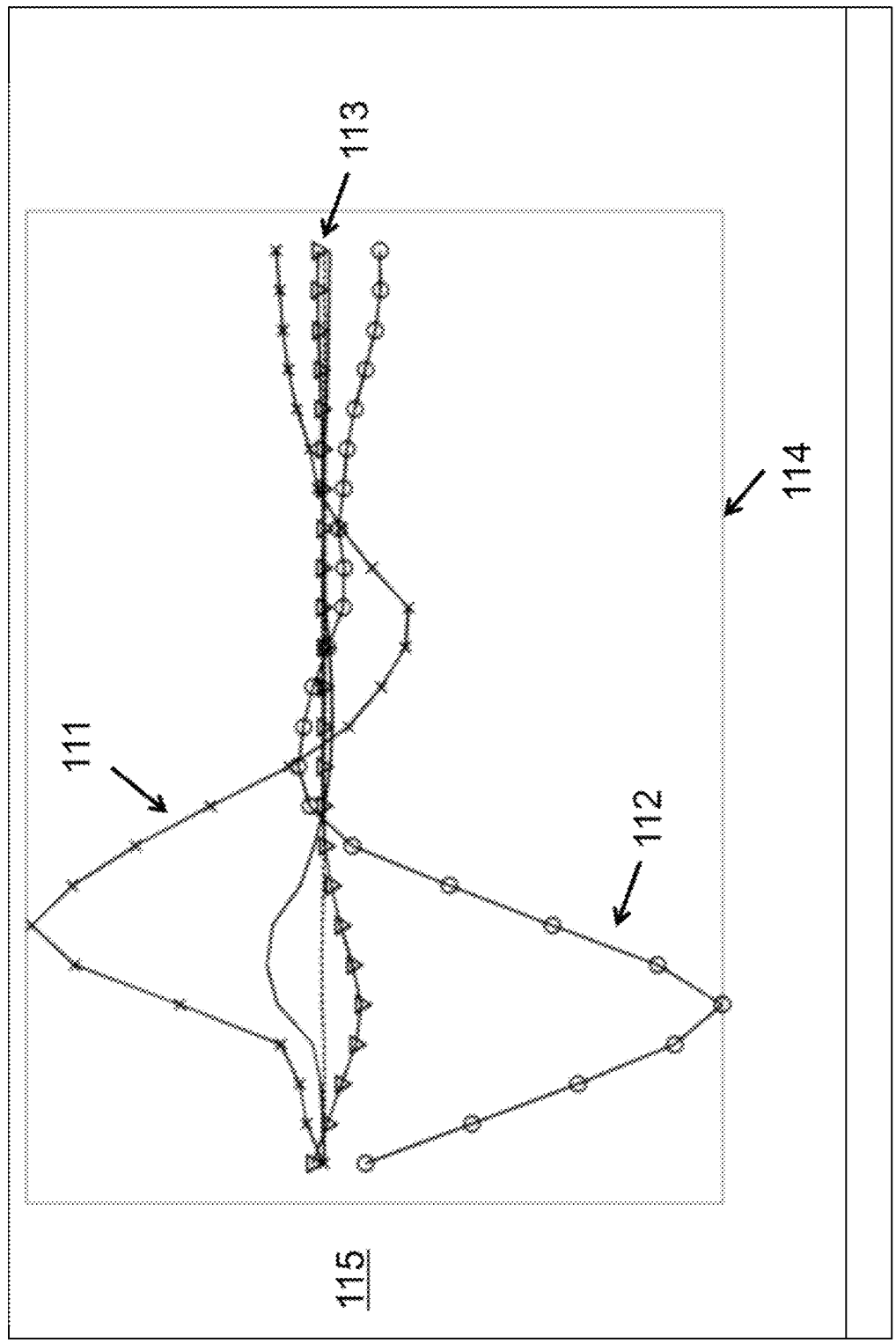
FIG. 9 is a graph depicting the time-varying currents in several of the dynamic shim magnet coils according to one embodiment of the invention.
Figure 10:
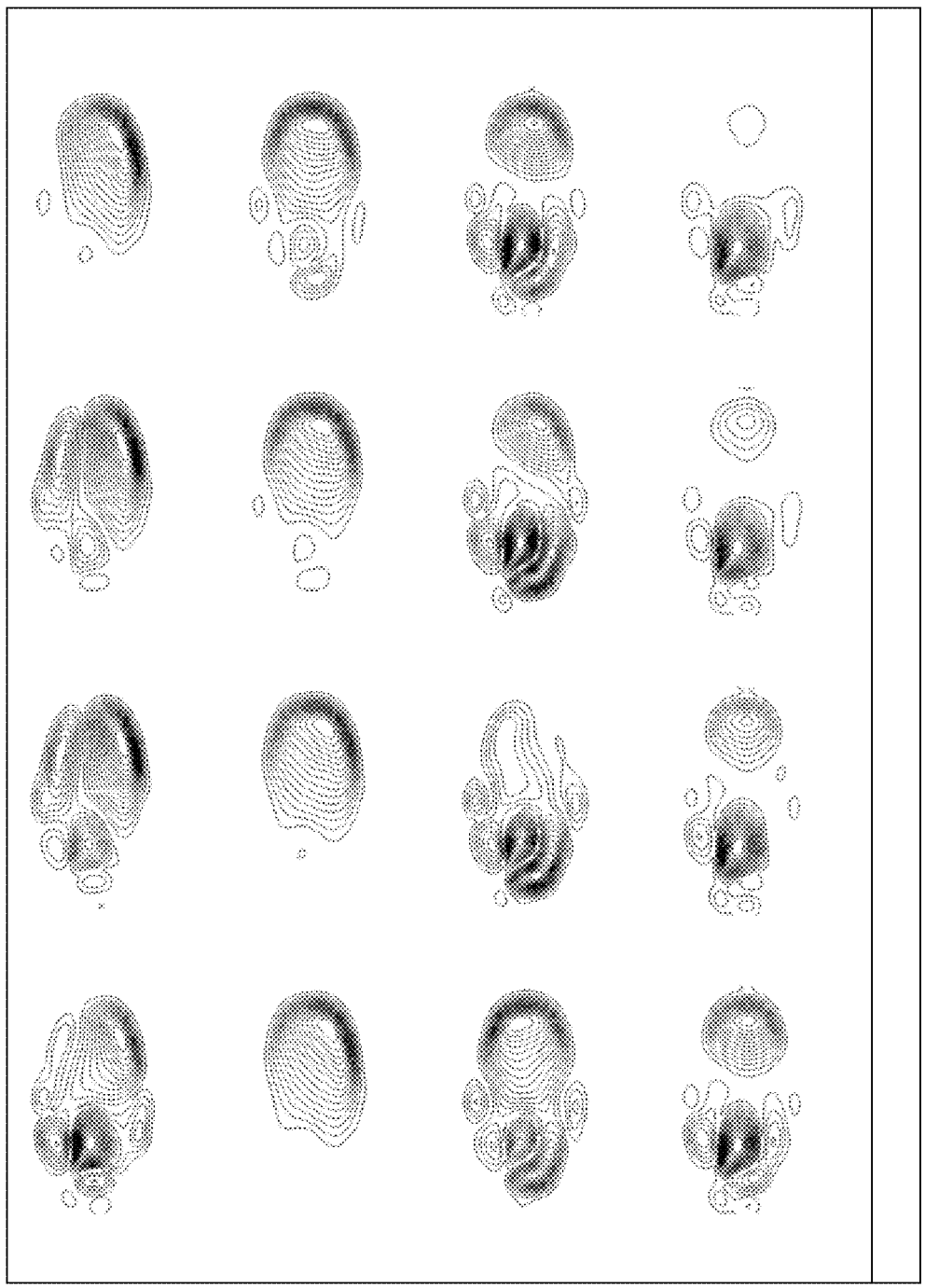
FIG. 10 is a series of 2D graphs depicting the time-varying magnetic field homogeneity within a single MR slice during adjustment of the current in several of the dynamic shim magnet coils.

FIG. 9 is a graph depicting the time-dependent currents $\beta_{k_y}$ 115 delivered to the dynamic shim coils. Time is represented on the x-axis 114 and current is represented on the y-axis 115. For example, the currents delivered to the two dynamic shim coils $B(x,y)=x^2-y^2$ 111 and $B(x,y)=2xy$ 112 are highlighted because they fluctuate with the greatest amplitude. The two currents delivered to dynamic shim coils $B(x,y)=x$ and $B(x,y)=y$ have small fluctuations 113. FIG. 10 is an illustration of the total magnetic field, which is the sum of the static magnetic field and the dynamic shim magnetic field for 16 different points in time. At each time-point, the sub-volume $V_k$ is homogenized using a particular algorithm 280.

As we will show, this approach eliminates artifacts associated with the heterogeneity of the magnetic field, but at the cost of a small departure of the reconstructed image resolution from the ideal situation. To simplify the discussion, we assume that the signal is spatially encoded using a magnetic field gradient, Cartesian k-space traversal and in the steady-state, such that the nuclear magnetization is not appreciably changed from one RF pulse to the next. This can be implemented in practice by applying a sufficient number of RF pulses between consecutive phase encoding steps. That is to say that following a change in the resonance frequency between two consecutive RF pulses $$\Delta\omega_{k_y} \to \Delta\omega_{k_y + \Delta k_y} \quad [26]$$

there will be some number of RF pulses for the magnetization to reach a new steady-state. Of course, this acquisition scheme is not ideal because of the considerable increase in scan time, but illustrates the principle behind the much faster, transient acquisition strategy that is actually used.

For each position $y_0$, a point spread function $\hat{\rho}(y)$ can be calculated by approximating the spin density as a delta function $\rho(y) = \delta(y - y_0)$ (cf. Eq. [12])

$$\hat{\rho}(y) = \sum_{-k_{y,max}}^{k_{y,max} - \Delta k_y} S(k_y, y) e^{ik_y y} dk_y \quad [27]$$

$$= e^{i(k_y y_0 + qy_0^2)} \sum_{-k_{y,max}}^{k_{y,max} - \Delta k_y} m(k_y, \beta(y_0)) e^{ik_y y} dk_y \quad [28]$$

$$\rho(y) = e^{i(k_y y_0 + qy_0^2)} \mathcal{F}^{-1}[m(k_y, \beta(y_0))] \quad [29]$$

The key feature of Eq. [17] is that the steady-state artifacts, which were before an image space artifact resulting in a dark band, are transformed into the frequency domain and, consequently, result in a loss of resolution. This is the critical feature of the new technique: rather severe artifacts are transformed into only small reductions in image resolution (FIG. 8).

In another method, it is possible to eliminate or reduce undesired signals by further post-processing of acquired data. For example, Gibb's ringing artifacts appear at positions whose local k-space coverage has been significantly truncated by the acquisition process. Mathematically, this situation occurs for any $k_s(x) \notin -K$, where K is the set of all spatial encoding vectors k. This means that the gradient echo arising from a particular position in the object is not sampled. This situation is identical to local spoiling in the presence of a strong nonlinear magnetic field. For those positions whose echoes lie near the boundary of the k-space coverage $k_s = -K$, significant Gibb's ringing may occur. To ameliorate this artifact, it is possible to post-process some of the acquired signals. For example, in one such post-processing step Tukey windowing of the acquired data can be performed. In another embodiment, RF pulses designed to produce a nonlinear phase 63 replace the nonlinear magnetic fields 230. Nonlinear phase preparation pulses are designed by sweeping the frequency of an RF field, in the presence of a magnetic field gradient, imparting on the magnetization a time-dependent phase {38,39}

$$\phi_e(z) = \phi_{RF}[\tau(z)] + [\tau_p - \tau(z)](z) \quad [30]$$

where $\tau_p$ is the overall duration of the frequency chirped pulse, and $$\phi_{RF}[\tau(z)] = \int_0^{\tau(z)} [O_t + Rt'] dt' \quad [31]$$

is the phase of the RF pulse at each instant $\tau(z)$. The overall phase accumulated by the spins is quadratic $$\phi_e[z] = -\frac{\gamma G_e L \tau_p}{8} + \frac{\gamma G_e \tau_p z}{2} - \frac{\gamma G_e \tau_p z^2}{2L} \quad [32]$$

The quadratic phase is combined with expressions for the MRI signal dependence (e.g. Eq. [5]) as one mechanism of nonlinear phase preparation.

REFERENCES

{1} Maudsley A A. Dynamic range improvement in NMR imaging using phase scrambling. Journal of Magnetic Resonance (1969) 1988; 76(2):287-305.
{2} Wedeen V J, Chao Y S, Ackerman J L. Dynamic range compression in MRI by means of a nonlinear gradient pulse. Magnetic Resonance in Medicine 1988; 6(3):287-295.
{3} Pipe J G. Spatial encoding and reconstruction in MRI with quadratic phase profiles. Magn Reson Med 1995; 33(1):24-33.
{4} Idiyatullin D, Corum C, Park J Y, Garwood M. Fast and quiet MRI using a swept radiofrequency. J Magn Reson 2006; 181(2):342-349.
{5} Ito S, Yamada Y. Alias-free image reconstruction using Fresnel transform in the phase-scrambling Fourier imaging technique. Magnetic Resonance in Medicine 2008; 60(2): 422-430.
{6} Ben-Eliezer N, Shrot Y, Frydman L. High-definition, single-scan 2D MRI in inhomogeneous fields using spatial encoding methods. Magnetic Resonance Imaging 2010; 28(1):77-86.
{7} Yamada Y, Tanaka K, Abe Z. NMR Fresnel transform imaging technique using a quadratic nonlinear field gradient. Review of Scientific Instruments 1992; 63(11):5348-5358.
{8} Koch K M, Rothman D L, de Graaf R A. Optimization of static magnetic field homogeneity in the human and animal brain in vivo. Progress in Nuclear Magnetic Resonance Spectroscopy 2009; 54(2):69-96.
{9} Juchem C, Muller-Bierl B, Schick F, Logothetis N K, Pfeuffer J. Combined passive and active shimming for in vivo MR spectroscopy at high magnetic fields. J Magn Reson 2006; 183(2):278-289.
{10} Dewdney A E, (DE); Siemens Aktiengesellschaft, assignee. Shimmed magnetic resonance examination apparatus, and shimming method and shimming components therefor. United States. 2003.
{11} Allis J L I, (GB2); Oxford Magnet Technology Limited (Oxford, GB), assignee. MRI magnets. United States. 1995.
{12} Kasten A K, (DE), Westphal, Michael (Offenbach, Del.); Bruker Analytik GmbH (Rheinstetten, Del.), assignee. Device for homogenizing a magnetic field. United States. 2003.
{13} Wilson J L, Jenkinson M, Jezzard P. Optimization of static field homogeneity in human brain using diamagnetic passive shims. Magn Reson Med 2002; 48(5):906-914.
{14} Cusack R, Russell B, Cox S M, De Panfilis C, Schwarzbauer C, Ansorge R. An evaluation of the use of passive shimming to improve frontal sensitivity in fMRI. Neuroimage 2005; 24(1):82-91.
{15} Roméo F, Hoult D I. Magnet field profiling: Analysis and correcting coil design. Magnetic Resonance in Medicine 1984; 1(1):44-65.
{16} Golay M J E. Field homogenizing coils for nuclear spin resonance instrumentation. Review of Scientific Instruments 1958; 29(4):313-315.
{17} O'donnell MS, (NY), Karr, Steven G. (Scotia, N.Y.), Barber, William D. (Ballston Lake, N.Y.), Wang, Jish M. (East Brunswick, N.J.), Edelstein, William A. (Schenectady, N.Y.); General Electric Company (Schenectady, N.Y.), assignee. Method for homogenizing a static magnetic field over an arbitrary volume. United States. 1987.
{18} Shen J. Effect of degenerate spherical harmonics and a method for automatic shimming of oblique slices. NMR in Biomedicine 2001; 14(3):177-183.
{19} Gruetter R, Boesch C. Fast, noniterative shimming of spatially localized signals. In vivo analysis of the magnetic field along axes. Journal of Magnetic Resonance (1969) 1992; 96(2):323-334.
{20} Blamire A M, Rothman D L, Nixon T. Dynamic shim updating: a new approach towards optimized whole brain shimming. Magn Reson Med 1996; 36(1):159-165.
{21} Morrell G, Spielman D. Dynamic shimming for multi-slice magnetic resonance imaging. Magnetic Resonance in Medicine 1997; 38(3):477-483.
{22} Poole, #160, Michael, Bowtell, Richard. Volume parcellation for improved dynamic shimming. Heidelberg, ALLEMAGNE: Springer; 2008. 10 p.
{23} Ernst T, Hennig J. Double-volume 1H spectroscopy with interleaved acquisitions using tilted gradients. Magn Reson Med 1991; 20(1):27-35.
{24} de Graaf R A, Brown P B, McIntyre S, Rothman D L, Nixon T W. Dynamic shim updating (DSU) for multislice signal acquisition. Magnetic Resonance in Medicine 2003; 49(3):409-416.
{25} Koch K M, McIntyre S, Nixon T W, Rothman D L, de Graaf R A. Dynamic shim updating on the human brain. Journal of Magnetic Resonance 2006; 180(2):286-296.
{26} Frydman L R, (IL), Shapira, Boaz (Rehovot, Ill.), Tal, Assaf (Rehovot, Ill.); METHOD AND APPARATUS FOR ACQUIRING HIGH RESOLUTION SPECTRAL DATA OR HIGH DEFINITION IMAGES IN INHOMOGENEOUS ENVIRONMENTS. United States. 2010.
{27} Tal A, Frydman L. Spatial encoding and the single-scan acquisition of high definition MR images in inhomogeneous fields. J Magn Reson 2006; 182(2):179-194.
{28} Frahm J, Merboldt K-D, Hanicke W. Direct FLASH MR imaging of magnetic field inhomogeneities by gradient compensation. Magnetic Resonance in Medicine 1988; 6(4):474-480.
{29} Ordidge R J, Gorell J M, Deniau J C, Knight R A, Helpern J A. Assessment of relative brain iron concentrations using T2-weighted and T2*-weighted MRI at 3 Tesla. Magnetic Resonance in Medicine 1994; 32(3):335-341.
{30} Constable R T. Functional MR imaging using gradient-echo echo-planar imaging in the presence of large static field inhomogeneities. Journal of Magnetic Resonance Imaging 1995; 5(6):746-752.
{31} Constable R T, Spencer D D. Composite image formation in z-shimmed functional MR imaging. Magn Reson Med 1999; 42(1):110-117.
{32} Prammer M G, Haselgrove J C, Shinnar M, Leigh J S. A new approach to automatic shimming. Journal of Magnetic Resonance (1969) 1988; 77(1):40-52.

{33} Prammer M G P, (PA), Haselgrove, John C. (Swarthmore, Pa.); Phospho-Energetics, Inc. (Philadelphia, Pa.), assignee. Device and method for automatic shimming of NMR instrument. United States. 1988.

{34} Schultz G, Ullman P, Lehr H, Welz A, Hennig J, Zaitsev M. Reconstruction of MRI Data Encoded with Arbitrarily Shaped, Curvilinear, Non-bijective Magnetic Fields. Magnetic Resonance in Medicine 2010.

{35} Gallichan D, Dewdney A, Schultz G, Hennig J, Zaitsev M. Simultaneously Driven Linear and Nonlinear Spatial Encoding Fields in MRI. Magnetic Resonance in Medicine 2010.

{36} Steady-State Free Precession in Nuclear Magnetic Resonance.

{37} Noll D C. Rapid MR image acquisition in the presence of background gradients. 2002. p 725-728.

{38} Kunz D. Use of frequency-modulated radiofrequency pulses in MR imaging experiments. Magnetic Resonance in Medicine 1986; 3(3):377-384.

{39} Garwood M, DelaBarre L. The Return of the Frequency Sweep: Designing Adiabatic Pulses for Contemporary NMR. Journal of Magnetic Resonance 2001; 153(2):155-177.

{40} W. Witschey, D. Gallichan, G. Schultz, M. Zaitsev, J. Hennig "MRI Localization with Nonlinear Gradients" Filing date: 23 Jul. 2010. Record number: EP 109 170 643.0

We claim:

1. A method to compensate for B0 magnetic field heterogeneity inside an object of investigation in an MR (=magnetic resonance) apparatus, the method comprising the steps of:
    a) determining, experimentally or theoretically, spatial field distributions and temporal switching characteristics of field manipulating coils present in the MR apparatus;
    b) obtaining an uncorrected B0 magnetic field distribution of the object of investigation by measuring (i) a heterogeneity of a static B0 magnetic field and (ii) a heterogeneity caused by susceptibility variations associated with the object of investigation;
    c) executing an MR sequence on the MR apparatus with a desired k-space coverage by applying one or several RF pulses to generate a transverse magnetization within the object of investigation, switching currents in field manipulating coils to effect a primary spatial encoding and recording MR signal data, wherein MR signal echoes originating from at least two different sub-volumes within a volume of transverse magnetization are temporally separating by generating a nonlinear phase distribution within the object of investigation;
    d) dynamically updating one or several magnetic field shimming parameters to compensate for field inhomogeneity distributions within the at least two different sub-volumes within the volume of transverse magnetization, wherein a time-varying current in field manipulation coils $\beta'(t)$ is thereby optimized using a calculation to optimize homogeneity from multiple locations within the object in accordance with a minimization algorithm, with $\beta'(t)$ being a vector of time-varying currents in shim magnet coils, wherein $\beta'(t)=\min_\beta \|x-X\beta(t)\|_2^2$, with x a vector of uncorrected magnetic fields at multiple locations within the object of investigation and X a particular basis function of spatial coordinates or of spherical harmonics, wherein $\beta(t)$ is the time-varying current being varied during optimization; and
    e) performing reconstruction of the MR signal data acquired in step (c) to produce one or more images or localized spectroscopic data, wherein artifacts in the reconstructed image which would result from the uncorrected B0 magnetic field distribution obtained in step b) are suppressed by the nonlinear phase distribution of step c) and the dynamic updating of field shimming parameters of step d).

2. The method of claim 1, wherein the nonlinear phase distribution of step c) is generated by applying a current to field manipulating coils, at least one of which having a nonlinear field distribution and/or by applying an appropriate RF-pulse or pulses resulting in a non-linear phase distribution of excited magnetization in at least one spatial dimension.

3. The method of claim 1, wherein the magnetic field heterogeneity arising from a plurality of sub-volumes within the object of investigation is decomposed into a basis set of N orthogonal functions and corrected using M magnet coils whose magnetic fields substantially compensate for the magnetic field heterogeneity.

4. The method of claim 2, wherein the at least one field manipulating coil with nonlinear magnetic field distribution produces a quadratic magnetic field spatial distribution of a form $(x^2+y^2-2z^2)$, $(x^2-y^2)$ or $(2xy)$ where x, y and z are coordinates used for primary spatial encoding of the generated transverse magnetization.

5. The method of claim 1, wherein preparing the nonlinear phase distribution and/or effecting the primary spatial encoding in step c) is performed in two or three dimensions.

6. The method of claim 1, wherein at least one of the field manipulating coils used to effect the primary spatial encoding in step c) produces a significantly nonlinear magnetic field.

7. The method of claim 1, wherein one or more spatially varying magnetic fields which are variable in time are applied simultaneously during transmission of the RF pulse or pulses in step c).

8. The method of claim 1, further comprising, subsequent to recording MR signals originating from the object of investigation in step (c), applying a current of inverted polarity to the one or several field manipulating coils to substantially eliminate the nonlinear phase distribution generated in step c).

9. The method of claim 1, wherein MR signals are recorded using a plurality of RF coils and an appropriate parallel imaging reconstruction technique, using SENSE, using GRAPPA or using variants thereof.

10. The method of claim 1, wherein a conventional imaging sequence, a gradient echo, a spin echo, a fast low angle shot (FLASH), a fast spin echo (FSE), a turbo spin echo (TSE), a rapid acquisition with relaxation enhancement (RARE), an echo planar imaging (EPI), a nuclear magnetic resonance spectroscopy technique and/or chemical shift imaging (CSI) are used for generating the image or spectroscopic data in step c).

11. The method of claim 1, wherein one among a plurality of established spatial encoding strategies, a Cartesian strategy, a radial strategy or a spiral spatial encoding strategy is used for acquisition of MR data.

12. The method of claim 1, wherein MR echoes are reordered in single- or multi-shot acquisitions.

13. The method of claim 1, wherein undesired signals are suppressed by post-processing of acquired MRI signals.

14. The method of claim 1, wherein each sub-volume is chosen as a localized sub-volume which predominately contributes signal to acquired data of a shot or to a set of shots of a multi-shot imaging sequence.

15. The method of claim 1, wherein each sub-volume is chosen as a localized sub-volume which predominately contributes signal to a subset of acquired data of a single-shot imaging sequence or to a subset of acquired data of an individual shot of a multi-shot imaging sequence.

16. The method of claim 1, further comprising the additional constraint of $$\frac{d\beta'}{dt} < \alpha_1 \text{ or } |\beta'| < \alpha_2,$$

wherein $\alpha_{1,2}$ are constraint parameters.

17. The method of claim 16, wherein the additional constraint is subject to Tikhonov regularization.

* * * * *